(12) United States Patent
Ishihara

(10) Patent No.: US 7,635,852 B2
(45) Date of Patent: Dec. 22, 2009

(54) OPTICAL COUPLER WITH FIRST AND SECOND DIVISION CONNECTOR PORTION

(75) Inventor: Takehisa Ishihara, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/955,931

(22) Filed: Dec. 13, 2007

(65) Prior Publication Data
US 2008/0142744 A1    Jun. 19, 2008

(30) Foreign Application Priority Data
Dec. 14, 2006    (JP)    ............... 2006-336986

(51) Int. Cl.
*G02B 27/00*    (2006.01)
(52) U.S. Cl. ....................... 250/551; 385/56
(58) Field of Classification Search ............... 250/551, 250/239; 257/81, 82, 698, 690, 692, 678, 257/727, 676; 385/56
See application file for complete search history.

(56) References Cited

U.S. PATENT DOCUMENTS 5,567,953 A    10/1996    Horinouchi et al.

2006/0280409 A1 * 12/2006 Koreeda et al. ............... 385/59

FOREIGN PATENT DOCUMENTS

| JP | 8-116085 A | 5/1996 |
|----|-----------|--------|
| JP | 8-125218 A | 5/1996 |

* cited by examiner

*Primary Examiner*—Georgia Y Epps
*Assistant Examiner*—Francis M Legasse, Jr.
(74) *Attorney, Agent, or Firm*—Birch, Stewart, Kolasch & Birch, LLP

(57) ABSTRACT

A device unit 46 is constituted by including a lead frame 50 on which a light-emitting mold portion 48 and a light-receiving mold portion 49 are mounted. Moreover, an exterior casing for housing the device unit 46 is constituted of two parts dividable into an upper casing 45 and a lower casing 47. Thus, by holding the device unit 46 by the upper casing 45 and the lower casing 47, external connection terminals 43 constructed of one end portion of the lead frame 50 can be fixed to the exterior casing and positioned in a connector portion 42. Therefore, by reducing the parts count to three and allowing the device unit 46 to be fixed to the exterior casing by a fixed fitting mechanism of the upper casing 45 and the lower casing 47 without performing welding, soldering, thermal caulking or the like, the assembling becomes easy.

8 Claims, 19 Drawing Sheets

Fig. 26A PRIOR ART    Fig. 26B PRIOR ART
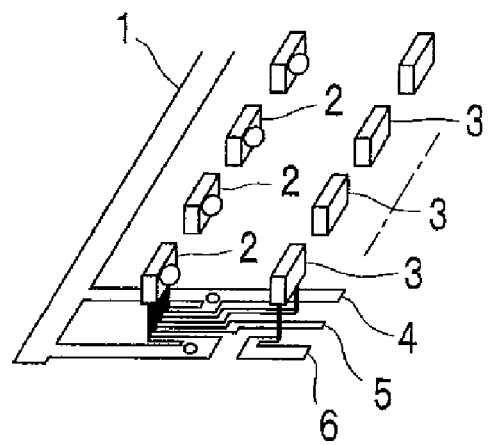
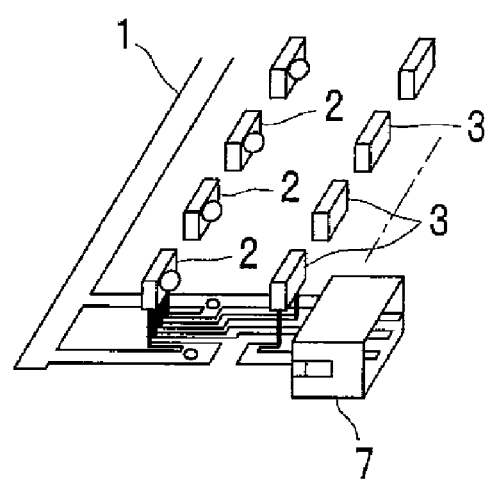
Fig. 26C PRIOR ART
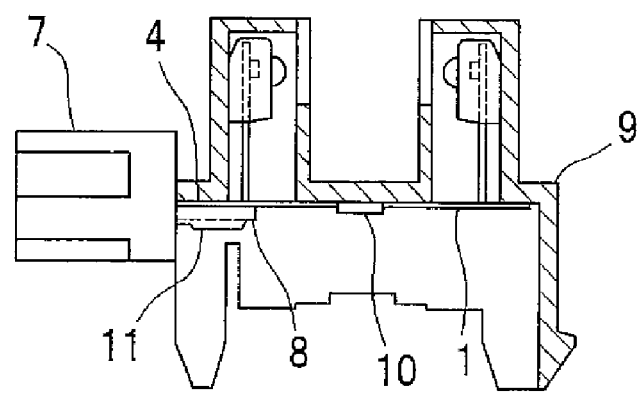

OPTICAL COUPLER WITH FIRST AND SECOND DIVISION CONNECTOR PORTION

CROSS-REFERENCE TO RELATED APPLICATIONS

This nonprovisional application claims priority under 35 U.S.C. §119(a) on Patent Application No(s). 2006-336986 filed in Japan on Dec. 14, 2006, the entire contents of which are hereby incorporated by reference.

BACKGROUND OF THE INVENTION

The present invention relates to an optical coupler (photo-interrupter) that has an object passageway in an optical path from a light-emitting device to a light-receiving device and detects the presence or absence of an object or the passage of an object, a manufacturing method therefor and electronic equipment that employs the optical coupler.

Conventional optical couplers having connector terminals include an optical coupler (JP3176496) as shown in FIGS. 26A through 26C, an optical semiconductor device (H08-125218 A) as shown in FIG. 27 and a semiconductor optical coupler (H08-116085 A) as shown in FIG. 28.

Reference is first made to JP3176496. FIGS. 26A and 26B show states on the way of the manufacturing process of an optical coupler, and FIG. 26C shows a cross section of the finished product.

As shown in FIG. 26A, a lead frame 1, on which a light-emitting device (not shown) and a light-receiving device (not shown) are bonded, wired and molded with a translucent resin, is bent in an appropriate position, making the light-receiving device and the light-emitting device face each other. FIG. 26A further shows a light-emitting device mold resin 2 and a light-receiving device mold resin 3. In this case, by cutting one end (cradle) of the lead frame 1 by lead cutting in a bending step for bending the lead frame 1, connector terminals 4, 5, 6 are formed.

Next, as shown in FIG. 26B, the lead frame 1 and a connector 7 are connected together by spot welding of the connector terminals 4, 5, 6 of the lead frame 1 to pins 8 (see FIG. 26C) of the connector 7.

Finally, as shown in FIG. 26C, the lead frame 1 connected to the connector 7 is housed in an exterior casing 9, and a pin 10 made of a thermoplastic resin for fixation provided at a portion of the exterior casing 9 to be fit to the lead frame 1 is inserted into a hole (not shown) provided at the lead frame 1. On the other hand, by inserting a pin 11 made of a thermoplastic resin for fixation provided at a portion of the exterior casing 9 in the vicinity of the connector terminals 4, 5, 6 (only the connector terminal 4 is seen in FIG. 26C) of the lead frame 1 in between the connector terminals 4, 5, 6 and deforming by heat the pins 10, 11 made of the thermoplastic resin, the lead frame 1 and the exterior casing 9 are fixed together. Since the pins 10 and 11 are deformed by heat in FIG. 26C, the shapes of the pins before the deformation are not shown.

Next, JP H08-125218 A is described. As shown in FIG. 27, a board 23 on which a light-emitting device 21 and a light-receiving device 22 are mounted is housed in a housing 27 that has a trench portion 24 at the center and internally has reflecting surfaces 25 and 26 on both sides with interposition of the trench portion 24 with the mounting surface of the light-emitting device 21 facing upward. Then, a plurality of connector pins 28 for external connection are electrically connected to a terminal portion of the board 23 by, for example, soldering.

Next, JP H08-116085 A is described. As shown in FIG. 28, the semiconductor optical coupler is formed by inserting a light-emitting device 33 and a light-receiving device 34 from above into a connection part 32 formed by insert molding of a thin conductive plate having connector terminals 31 and a device socket portion with a plastic resin, attaching a casing 35 formed of a light-shielding resin to it and thereafter press fitting a connector housing 36 to the connector terminals 31. In this case, the connector housing 36 is selected according to the opposite side connector 37 to be connected.

However, the conventional optical coupler disclosed in JP3176496, the conventional optical semiconductor device disclosed in JP H08-125218 and the conventional semiconductor optical coupler disclosed in JP H08-116085 have the problems as follows.

That is, in the conventional optical coupler disclosed in JP3176496 and the conventional optical semiconductor device disclosed in JP H08-125218, a step (spot welding, soldering and the like) for connecting the connector to the lead frame (board) and a step (thermal caulking and the like) for joining the mutually connected connectors and the lead frame (board) to the exterior casing (housing) are necessary for the individual three parts constructed of the connector, the lead frame (board) and the exterior casing (housing). This therefore leads to the problems of a large parts count and many steps necessary for the assembling.

Moreover, in the conventional semiconductor optical coupler disclosed in JP H08-116085, the connector housing 36 is fixed by press fitting to the terminals 31 of the thin conductive plate. Accordingly, there is the problem that a whisker is generated from a portion to which a pressure is applied at the terminals 31 in the case of, for example, tin-plated terminals 31 and it is possible that an electrical shortcircuit occurs between the terminals 31 and between the terminals of the light-emitting device 33 and the light-receiving device 34.

There is a further problem that the opposite side connector 37 having a pitch of 2 mm cannot be inserted in, for example, a case where the terminals 31 have a pitch of 1.5 mm. Generally, there are numbers of kinds of connectors, and it is necessary to prepare semiconductor optical couplers by the number of different connectors, leading to problems in terms of inventory control and production control.

SUMMARY OF THE INVENTION

An object of the present invention is to provide an optical coupler that has a reduced parts count and is easily assembled.

In order to achieve the above object, there is provided an optical coupler comprising:

a lead frame on which a light-emitting device and a light-receiving device molded with a translucent resin are mounted and which has an external connection terminal for external connection at one end; and an exterior casing that is formed of a light-shielding resin and has a connector portion and houses the lead frame integrated therewith, wherein the connector portion can be divided into a first division connector portion including a first division connector housing and a second division connector portion including a second division connector housing, the exterior casing can be divided into a first division casing including the first division connector portion and a second division casing including the second division connector portion and houses the lead frame therein by holding the lead frame by the first division casing and the second division casing, and the external connection terminal is housed in the connector portion formed of the first division connector portion and the second division connector portion in a state in which the lead frame is housed in the exterior casing and fixed by the first division casing and the second division casing.

According to the above construction, the exterior casing can be divided into the first division casing and the second division casing, and by holding the lead frame by the first division casing and the second division casing, the lead frame can be stored inside. Therefore, the parts count of the optical coupler can be reduced to three. Furthermore, when the lead frame is housed in the exterior casing, the external connection terminals are housed in the connector portion and fixed held by the first division casing and the second division casing. Therefore, by fixing the first division casing and the second division casing to each other by, for example, a fixed fitting mechanism, the optical coupler can easily be assembled without using welding or soldering.

In one embodiment of the invention, a groove is formed at a joining surface of the first division connector housing to the second division connector housing and a joining surface of the second division connector housing to the first division connector housing so as to form a through hole when the first division connector portion and the second division connector portion are integrally joined together and in the through hole the external connection terminal is to be inserted, and assuming that an outside diameter of the external connection terminal is L1 and a width of the groove is C1, then a relation: $C1 \geq L1$ holds.

According to the present embodiment, when it is assumed that the external connection terminals have the outside diameter of L1 and the grooves that form the through holes in which the external connection terminals are inserted has the width of C1, there is the relation: $C1 \geq L1$. Accordingly, there is no possibility of the application of a pressure to the external connection terminals at the boundary between the external connection terminals and the through hole when the external connection terminals are inserted into the through hole formed when the first division connector portion and the second division connector portion are integrally joined, and the generation of a whisker can be suppressed.

In one embodiment of the invention, a through hole in which the external connection terminal is inserted is formed at either one of the first division connector housing and the second division connector housing, and, assuming that an outside diameter of the external connection terminal is L1 and an inner diameter of the through hole is C1, then a relation: $C1 \geq L1$ holds.

According to the present embodiment, when it is assumed that the external connection terminals have the outside diameter of L1 and the through hole which is formed at either one of the first division connector housing and the second division connector housing and in which the external connection terminals are inserted has the width of C1, there is the relation: $C1 \geq L1$. Accordingly, there is no possibility of the application of a pressure to the external connection terminals at the boundary between the external connection terminals and the through hole when the external connection terminals are inserted into the through hole, and the generation of a whisker can be suppressed.

In one embodiment of the invention, a groove is formed at a joining surface of the first division connector housing to the second division connector housing and a joining surface of the second division connector housing to the first division connector housing so as to form a through hole when the first division connector portion and the second division connector portion are integrally joined together and in the through hole the external connection terminal is to be inserted, a plurality of projections are provided on an inner surface of the groove annularly arranged in a plane perpendicular to a central axis of the groove, the projections are provided so as not to be positioned at outer end surfaces of the first division connector housing and the second division connector housing, and, assuming that an outside diameter of the external connection terminal is L1, and an interval between the projections measured in a widthwise direction of the groove is C1, then a relation: $C1 < L1$ holds.

According to the present embodiment, when it is assumed that the external connection terminals have the outside diameter of L1 and the interval between the projections measured in the widthwise direction of the grooves that form the through holes in which the external connection terminals are inserted is C1, there is the relation: $C1 < L1$. Therefore, when the external connection terminals are inserted into the through holes formed when the first division connector portion and the second division connector portion are integrally joined together, the projections made of the light-shielding resin are elastically deformed to allow the external connection terminals to be held. Therefore, no gap is generated between the connector housing constituted by joining the first division connector housing to the second division connector housing and the external connection terminals, so that the external connection terminals can be fixed to the connector portion without looseness. Furthermore, the projections are provided so as not to be located at the outer end surfaces of the first division connector housing and the second division connector housing. Therefore, even if a whisker is generated at the boundary between the external connection terminals and the through holes as a consequence of the application of a pressure to the external connection terminals, the generated whisker does not come out of the outer end surface of the connector housing, and the occurrence of an electrical short-circuit attributed to the whisker can be suppressed.

In one embodiment of the invention, a plurality of the connector portions that house the external connection terminal fixed by the first division casing and the second division casing.

According to the present embodiment, when the plurality of connector portions are provided by, for example, connector portions of which the array pitch or the like of the external connection terminals is varied, there is no need to prepare a plurality of optical couplers of which the connector portions are only varied, and the inventory control and the production control of the optical coupler become easy.

In one embodiment of the invention, a plurality of pads connected to pins that have an identical function at the plurality of connector portions are provided for either one of a light-emitting mold portion where the light-emitting device is molded with a translucent resin and a light-receiving mold portion where the light-receiving device is molded with a translucent resin at the lead frame, and the plurality of pads connected to the pins that have the identical function are mutually electrically connected in the light-emitting mold portion or the light-receiving mold portion.

According to the present embodiment, the plurality of pads connected to the pins that have an identical function at the plurality of connector portions are electrically connected together in either one of the light-emitting mold portion and the light-receiving mold portion. Therefore, by taking the places of the pads in the light-emitting mold portion or the light-receiving mold portion into consideration, the pin arrangement in the plurality of connector portions can be made the desired arrangement. That is, according to the present invention, the pin arrangement of varied connector portions can be made identical.

Also, there is provided an optical coupler manufacturing method comprising the steps of:

providing internal wiring of a light-emitting device and a light-receiving device mounted on a lead frame that has at one end side external connection terminals for external connection whose array pitch changes partway from a first array pitch to a second array pitch and thereafter forming a light-emitting mold portion and a light-receiving mold portion by performing molding of the light-emitting device and the light-receiving device with a translucent resin; and selectively performing lead cutting in a position that includes either a region of the first array pitch or a region of the second array pitch of the external connection terminals of the lead frame on which the light-emitting mold portion and the light-receiving mold portion are formed, wherein, when the lead frame is subjected to lead cutting in the position that includes the region of the first array pitch, the method further comprising the steps of:

forming a first upper casing that has a light-emitting device housing chamber for housing an upper side of the light-emitting mold portion located on a light-emitting side of the lead frame and a light-receiving device housing chamber for housing an upper side of the light-receiving mold portion and is formed integrally with an upper connector portion that has an upper connector housing having grooves in which the external connection terminals of the first array pitch of the lead frame are inserted;

forming a first lower casing that has a light-emitting side recess portion with which a lower side of the light-emitting mold portion located on a side opposite from the light-emitting side of the lead frame is engaged and a light-receiving side recess portion with which a lower side of the light-receiving mold portion is engaged and is formed integrally with a lower connector portion that has a lower connector housing having grooves in which the external connection terminals of the first array pitch of the lead frame are inserted; and forming an optical coupler having a connector portion whose array pitch of the external connection terminals is the first array pitch by holding the lead frame that has undergone the lead cutting by means of the first upper casing and the first lower casing, or, when the lead frame is subjected to lead cutting in the position that includes the region of the second array pitch, the method further comprising the steps of:

forming a second upper casing that has a light-emitting device housing chamber for housing an upper side of the light-emitting mold portion located on a light-emitting side of the lead frame and a light-receiving device housing chamber for housing an upper side of the light-receiving mold portion and is formed integrally with an upper connector portion that has an upper connector housing having grooves in which the external connection terminals of the second array pitch of the lead frame are inserted;

forming a second lower casing that has a light-emitting side recess portion with which a lower side of the light-emitting mold portion located on a side opposite from the light-emitting side of the lead frame is engaged and a light-receiving side recess portion with which a lower side of the light-receiving mold portion is engaged and is formed integrally with a lower connector portion that has a lower connector housing having grooves in which the external connection terminals of the second array pitch of the lead frame are inserted; and forming an optical coupler having a connector portion whose array pitch of the external connection terminals is the second array pitch by holding the lead frame that has undergone the lead cutting by means of the second upper casing and the second lower casing.

According to the above construction, by only changing the cutting position of the lead frame that has the external connection terminals of which the array pitch is changed partway from the first array pitch to the second array pitch on one end side, either one of the optical coupler of which the array pitch of the external connection terminals is the first array pitch and the optical coupler that has a connector portion of the second array pitch can be selectively formed. Accordingly, there is no need to individually form the lead frame of which the array pitch of the external connection terminals is the first array pitch and the lead frame of the second array pitch, and optical couplers having varied connector portions can be selectively manufactured from the lead frame of one kind.

That is, according to the present invention, the inventory control and the production control of the lead frame become easy, allowing the manufacturing cost of the optical coupler to be reduced.

Also, there is provided an optical coupler manufacturing method comprising the steps of:

providing internal wiring of a light-emitting device and a light-receiving device mounted on a lead frame that has at one end side external connection terminals for external connection and thereafter forming a light-emitting mold portion and a light-receiving mold portion by performing molding of the light-emitting device and the light-receiving device with a translucent resin; and selectively performing lead cutting in a position that includes either a first prescribed position or a second prescribed position located on the outer side of the first prescribed position of the external connection terminals of the lead frame on which the light-emitting mold portion and the light-receiving mold portion are formed, wherein, when the lead frame is subjected to lead cutting in the position that includes the first prescribed position, the method further comprising the steps of:

forming a first lower casing that has a light-emitting side recess portion with which a lower side of the light-emitting mold portion located on a side opposite from a light-emitting side of the lead frame is engaged and a light-receiving side recess portion with which a lower side of the light-receiving mold portion is engaged and is formed integrally with a lower connector portion that has a lower connector housing having grooves in which the external connection terminals of the lead frame are inserted in a horizontal direction;

forming a first upper casing that has a light-emitting device housing chamber for housing an upper side of the light-emitting mold portion located on the light-emitting side of the lead frame and a light-receiving device housing chamber for housing an upper side of the light-receiving mold portion and is formed integrally with an upper connector portion that has an upper connector housing having grooves in which the external connection terminals of the lead frame are inserted in a horizontal direction; and forming an optical coupler having a connector portion whose external connection terminals extend in the horizontal direction by holding the lead frame that has undergone the lead cutting by means of the first upper casing and the first lower casing, or, when the lead frame is subjected to lead cutting in the position that includes the second prescribed position, the method further comprising the steps of: bending the external connection terminals to a side opposite from the light-emitting side of the light-emitting mold portion;

forming a second lower casing that has a light-emitting side recess portion with which a lower side of the light-emitting mold portion located on the side opposite from the light-emitting side of the lead frame is engaged and a light-receiving side recess portion with which a lower side of the light-receiving mold portion is engaged and is formed integrally with a lower connector portion that has a lower connector housing having through holes in which the bent external connection terminals of the lead frame are inserted in a generally perpendicular direction;

forming a second upper casing that has a light-emitting device housing chamber for housing an upper side of the light-emitting mold portion located on the light-emitting side of the lead frame and a light-receiving device housing chamber for housing an upper side of the light-receiving mold portion and is formed integrally with an upper connector portion that has an upper connector housing fit closely to the lower connector housing of the second lower casing; and forming an optical coupler having a connector portion in which the external connection terminals extend generally perpendicularly to a main body by holding the lead frame of which the bent external connection terminals are inserted in the through holes formed at the lower connector housing of the second lower casing by means of the second upper casing and the second lower casing.

According to the above construction, by only changing the cutting position of the external connection terminals of the lead frame to the first prescribed position or to the second prescribed position and bending the terminals when the lead frame is cut in the second prescribed position, either one of the optical coupler that has a connector portion whose direction in which the external connection terminals extend is horizontal to the main body and the optical coupler that has a connector portion whose direction in which the external connection terminals extend is generally perpendicular to the main body can be selectively formed. Therefore, optical couplers having varied connector portions can be selectively manufactured from the lead frame of one kind.

That is, according to the present invention, the inventory control and the production control of the lead frame become easy, allowing the manufacturing cost of the optical coupler to be reduced.

Also, there is provided an optical coupler manufacturing method comprising the steps of:

providing internal wiring of a light-emitting device and a light-receiving device mounted on a lead frame that has first external connection terminals at one end side and second external connection terminals at the other end side and thereafter forming a light-emitting mold portion and a light-receiving mold portion by performing molding of the light-emitting device and the light-receiving device with a translucent resin; and selectively performing lead cutting in a position that includes any one of: an extremity side of the first external connection terminals and a root portion of the second external connection terminals; a root portion of the first external connection terminals and an extremity side of the second external connection terminals; or the extremity side of the first external connection terminals and the extremity side of the second external connection terminals of the lead frame on which the light-emitting mold portion and the light-receiving mold portion are formed, wherein, when the lead frame is subjected to lead cutting in the position that includes the extremity side of the first external connection terminals and the root portion of the second external connection terminals, the method further comprising the steps of:

forming a first upper casing that has a light-emitting side housing chamber for housing an upper side of the light-emitting mold portion located on a light-emitting side of the lead frame and a light-receiving side housing chamber for housing an upper side of the light-receiving mold portion and is formed integrally with an upper connector portion that has an upper connector housing having grooves in which the first external connection terminals of the lead frame are inserted on one end side;

forming a first lower casing that has a light-emitting side recess portion with which a lower side of the light-emitting mold portion located on a side opposite from the light-emitting side of the lead frame is engaged and a light-receiving side recess portion with which a lower side of the light-receiving mold portion is engaged and is formed integrally with a lower connector portion that has a lower connector housing having grooves in which the first external connection terminals of the lead frame are inserted on one end side; and forming an optical coupler having a connector portion at the one end by holding the lead frame that has undergone the lead cutting by means of the first upper casing and the first lower casing, or, when the lead frame is subjected to lead cutting in the position that includes the root portion of the first external connection terminals and the extremity side of the second external connection terminals, the method further comprising the steps of:

forming a second upper casing that has a light-emitting device housing chamber for housing the upper side of the light-emitting mold portion located on the light-emitting side of the lead frame and a light-receiving device housing chamber for housing the upper side of the light-receiving mold portion and is formed integrally with an upper connector portion that has an upper connector housing having grooves in which the second external connection terminals of the lead frame are inserted on the other end side;

forming a second lower casing that has a light-emitting side recess portion with which a lower side of the light-emitting mold portion located on a side opposite from the light-emitting side of the lead frame is engaged and a light-receiving side recess portion with which a lower side of the light-emitting mold portion is engaged and is formed integrally with a lower connector portion that has a lower connector housing having grooves in which the second external connection terminals of the lead frame are inserted on the other end side; and forming an optical coupler having a connector portion at the other end by holding the lead frame that has undergone the lead cutting by means of the second upper casing and the second lower casing, or, when the lead frame is subjected to lead cutting in the position that includes the extremity side of the first external connection terminals and the extremity side of the second external connection terminals, the method further comprising the steps of:

forming a third upper casing that has a light-emitting device housing chamber for housing the upper side of the light-emitting mold portion located on the light-emitting side of the lead frame and a light-receiving device housing chamber for housing the upper side of the light-receiving mold portion and is formed integrally with a first upper connector portion that has a first upper connector housing having grooves in which the first external connection terminals of the lead frame are inserted on one end side and formed integrally with a second upper connector portion that has a second upper connector housing having grooves in which the second external connection terminals of the lead frame are inserted on the other end side;

forming a third lower casing that has a light-emitting side recess portion with which the lower side of the light-emitting mold portion located on the side opposite from the light-emitting side of the lead frame is engaged and a light-receiving side recess portion with which the lower side of the light-receiving mold portion is engaged and is formed integrally with a first lower connector housing that has a first lower connector housing having grooves in which the first external connection terminals of the lead frame are inserted on one end side and formed integrally with a second lower connector portion that has a second lower connector housing having grooves in which the second external connection terminals of the lead frame are inserted on the other end side; and forming an optical coupler that has connector portions on both end sides by holding the lead frame that has undergone the lead cutting by means of the third upper casing and the third lower casing.

According to the above construction, by only changing the cutting position of the lead frame that has the external connection terminals on one end side and the other end side, any one of the optical coupler that has the connector portion on one end side, the optical coupler that has the connector portion on the other end side and the optical coupler that has the connector portions on both end sides can be selectively formed. Therefore, optical couplers having connector portions of which the array pitches and placement positions and the number of places are varied can be selectively manufactured from the lead frame of one kind.

That is, according to the present invention, the inventory control and the production control of the lead frame become easy, allowing the manufacturing cost of the optical coupler to be reduced.

Also, there is provided an optical coupler manufacturing method comprising the steps of:

providing internal wiring of a light-emitting device and a light-receiving device mounted on a lead frame that has external connection terminals for external connection on one end side and thereafter forming a light-emitting mold portion and a light-receiving mold portion by performing molding of the light-emitting device and the light-receiving device with a translucent resin;

performing lead cutting of the lead frame at which the light-emitting mold portion and the light-receiving mold portion are formed;

forming a first upper casing that has a light-emitting device housing chamber for housing the light-emitting mold portion on the lead frame and a light-receiving device housing chamber for housing the light-receiving mold portion on the lead frame and is formed integrally with an upper connector portion that has the upper connector housing having grooves in which the external connection terminals of the lead frame are inserted with a structure capable of detecting light that is emitted from the light-emitting device of the light-emitting mold portion housed in the light-emitting device housing chamber and passes through a space which is provided in between the light-emitting device housing chamber and the light-receiving device housing chamber and through which a subject to be detected passes by means of the light-receiving device of the light-receiving mold portion housed in the light-receiving device housing chamber;

forming a second upper casing that has a light-emitting device housing chamber for housing the light-emitting mold portion on the lead frame and a light-receiving device housing chamber for housing the light-receiving mold portion and is formed integrally with the upper connector portion that has the upper connector housing having grooves in which the external connection terminals of the lead frame are inserted with a structure capable of detecting light that is emitted from the light-emitting device of the light-emitting mold portion housed in the light-emitting device housing chamber and is reflected on the subject to be detected that passes through the space in between the light-emitting device housing chamber and the light-receiving device housing chamber by means of the light-receiving device of the light-receiving mold portion housed in the light-receiving device housing chamber;

forming a lower casing for housing a lower side of the lead frame and is formed integrally with the lower connector portion having a lower connector housing where grooves in which the external connection terminals of the lead frame are inserted are provided; and selectively forming a light-interrupting type optical coupler by holding the lead frame that has undergone the lead cutting by means of the first upper casing and the lower casing or selectively forming a light-reflecting type optical coupler by holding the lead frame that has undergone the lead cutting by means of the second upper casing and the lower casing.

According to the above construction, by only changing the upper casing to the first upper casing having the structure capable of detecting the light that has been emitted from the light-emitting device and passed through the space through which the subject to be detected passes by the light-receiving device or to the second upper casing having the structure capable of detecting the light that has been emitted from the light-emitting device and reflected on the subject to be detected by the light-receiving device, either one of the light-interrupting type optical coupler and the light-reflecting type optical coupler can be selectively formed. Therefore, optical couplers of varied detection types can be selectively manufactured from the lower casing of one kind.

That is, according to the present invention, the inventory control and the production control of the lower casing become easy, allowing the manufacturing cost of the optical coupler to be reduced.

In one embodiment of the invention, an electronic equipment employs the above optical coupler.

According to the above construction, the optical coupler of which the parts count can be reduced and the assembling steps can be simplified is employed. Therefore, electronic equipment such as copiers and printers can be manufactured at low cost.

In one embodiment of the invention, an electronic equipment employs the optical coupler manufactured by the above optical coupler manufacturing method.

According to the above construction, the optical coupler manufactured by the optical coupler manufacturing method capable of reducing the manufacturing cost is employed, electronic equipment such as copiers and printers can be manufactured at low cost.

As is apparent from the above, the optical coupler of the present invention allows the exterior casing to be divided into the first division casing and the second division casing and houses the lead frame inside by holding the lead frame by the first division casing and the second division casing. Therefore, the parts count of the optical coupler can be reduced to three. Furthermore, the external connection terminals are housed in the connector portion and fixed held by the first division casing and the second division casing when the lead frame is housed in the exterior casing. Therefore, the optical coupler can be easily manufactured using neither welding nor soldering.

Moreover, the optical coupler manufacturing method of the present invention selectively forms either one of the optical coupler that has the connector portion of which the array pitch of the external connection terminals is the first array pitch and the optical coupler that has the connector portion of the second array pitch by changing the cutting position of the lead frame that has the external connection terminals of which the array pitch is changed partway from the first array pitch to the second array pitch on one end side. Accordingly, there is no need to prepare a plurality of kinds of lead frames according to the array pitch of the external connection terminals, and optical couplers having varied connector portions can be selectively manufactured from the lead frame of one kind. Therefore, the inventory control and the production control of the lead frame become easy, and the manufacturing cost of the optical coupler can be reduced.

Moreover, the optical coupler manufacturing method of the present invention selectively forms either one of the optical coupler that has the connector portion whose direction in which the external connection terminals extend is horizontal and the optical coupler that has the connector portion whose direction in which the external connection terminals extend is generally perpendicular to the main body by changing the cutting position of the external connection terminals of the lead frame to either one of the first prescribed position and the second prescribed position and bending the lead frame when it is cut in the second prescribed position. Accordingly, there is no need to prepare a plurality of kinds of lead frames according to the direction in which the connector portion extends, and optical couplers having varied connector portions can be selectively manufactured from the lead frame of one kind. Therefore, the inventory control and the production control of the lead frame become easy, and the manufacturing cost of the optical coupler can be reduced.

Moreover, the optical coupler manufacturing method of the present invention selectively forms any one of the optical coupler that has the connector portion on one end side, the optical coupler that has the connector portion on the other end side and the optical coupler that has the connector portions on both end sides by changing the cutting position of the lead frame that has the external connection terminals on one end side and the other end side. Accordingly, there is no need to prepare a plurality of kinds of lead frames according to the array pitches and placement positions and the number of places of the connector portion in the optical coupler, and optical couplers having varied connector portions can be selectively manufactured from the lead frame of one kind. Therefore, the inventory control and the production control of the lead frame become easy, and the manufacturing cost of the optical coupler can be reduced.

Moreover, the optical coupler manufacturing method of the present invention selectively forms either one of the light-interrupting type optical coupler and the light-reflecting type optical coupler by changing the upper casing to the first upper casing having the structure capable of detecting the light that has been emitted from the light-emitting device and passed through the space through which the subject to be detected passes by the light-receiving device or to the second upper casing having the structure capable of detecting the light that has been emitted from the light-emitting device and reflected on the subject to be detected by the light-receiving device. Therefore, optical couplers having varied detection types can be selectively manufactured from the lead frame of one kind. Therefore, the inventory control and the production control of the lower casing become easy, and the manufacturing cost of the optical coupler can be reduced.

Moreover, the electronic equipment of the present invention employs the optical coupler of which the parts count can be reduced and the assembling steps can be simplified. Therefore, electronic equipment such as copiers and printers can be manufactured at low cost.

Moreover, the electronic equipment of the present invention employs the optical coupler manufactured by the optical coupler manufacturing method of which the manufacturing cost can be reduced. Therefore, electronic equipment such as copiers and printers can be manufactured at low cost.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIGS. 26A through 26C are explanatory views of a connector connection structure in a conventional optical coupler;

DETAILED DESCRIPTION OF THE INVENTION

Figure 1A:
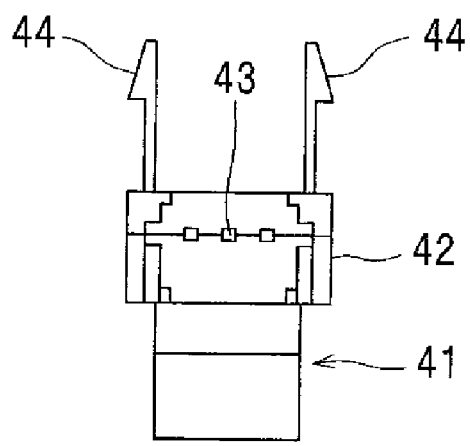
FIGS. 1A through 1C are views showing the construction of the optical coupler of the present invention.

The present invention will be described in detail below by the embodiments shown in the drawings.

The First Embodiment

Figure 1B:
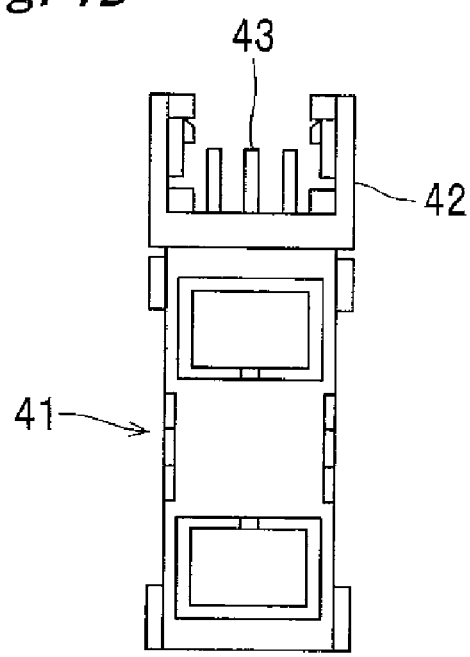
Figure 1C:
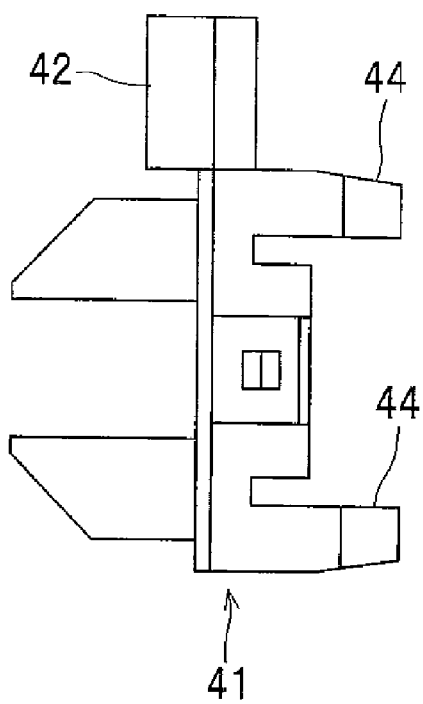

FIG. 1 is a view showing the construction of the optical coupler of the present embodiment. It is noted that FIG. 1A is a front view, FIG. 1B is a top view, and FIG. 1C is a side view. FIG. 2 shows a cross section of the optical coupler shown in FIG. 1.

First of all, the external shape of the present optical coupler is simply described with reference to FIGS. 1A through 1C. As shown in FIGS. 1A and 1B, an exterior casing 41 is formed integrally with a connector portion 42, and external connection terminals 43 are formed at the connector portion 42. The connector portion 42 is formed to have a shape such that the external connection terminals 43 can be seen from the upper side as shown in FIG. 1B, but the external connection terminals 43 cannot be seen from a side surface as shown in FIG. 1C. However, the shape of the connector portion 42 is not limited to this, and there is no particular limitation on the shape so long as the shape corresponds to the female type connector to be connected.

Fitting feet 44 for fitting to an external board (not shown) or external equipment are provided at four corners of bottom portions of the exterior casing 41. Moreover, as shown in FIG. 1A, the external connection terminals 43 are formed at the front surface of the connector portion 42.

Next, the internal structure of the present optical coupler is described with reference to FIGS. 2A and 2B. FIG. 2B shows the present optical coupler shown in FIG. 2A in a state in which it is separated into an upper casing 45 as the first division casing, a device unit 46 and a lower casing 47 as the second division casing.

As shown in FIG. 2B, the present optical coupler is constructed of the three parts of: the upper casing 45, as the first division connector portion, formed of a light-shielding resin and integrally with an upper connector portion 42a; the device unit 46 that includes a lead frame 50 on which a light-emitting mold portion 48 and a light-receiving mold portion 49 are mounted; and the lower casing 47, as the second division connector portion, formed of a light-shielding resin and integrally with a lower connector portion 42b.

The upper casing 45 and the lower casing 47 are integrally joined together to form the exterior casing 41.

A light-emitting device housing chamber 52 in which a first reflecting surface 51 that reflects light emitted from a light-emitting chip (not shown) in the light-emitting mold portion 48 is provided, a light-receiving device housing chamber 54 in which a second reflecting surface 53 that reflects incident light toward a light-receiving chip (not shown) in the light-receiving mold portion 49 is provided, and an engagement hole 56 with which a fixing claw 55 of the lower casing 47 is engaged are formed at the upper casing 45. Moreover, the fitting feet 44, the fixing claw 55 to be engaged with the engagement hole 56 of the upper casing 45, a light-emitting side recess portion 57 with which a portion of the light-emitting mold portion 48 on the lower side of the lead frame 50 is engaged and a light-receiving side recess portion 58 with which a portion of the light-receiving mold portion 49 on the lower side of the lead frame 50 is engaged are formed at the lower casing 47. Moreover, external connection terminals 43, which become end portions of the lead frame 50 on the connector portion 42 side are formed at the device unit 46.

The upper casing 45 and the lower casing 47 are manufactured by injection molding. In this case, the first reflecting surface 51 and the second reflecting surface 52 are easily formed of a white resin that contains titanium oxide and has a reflectance of about 90%.

Figure 3:
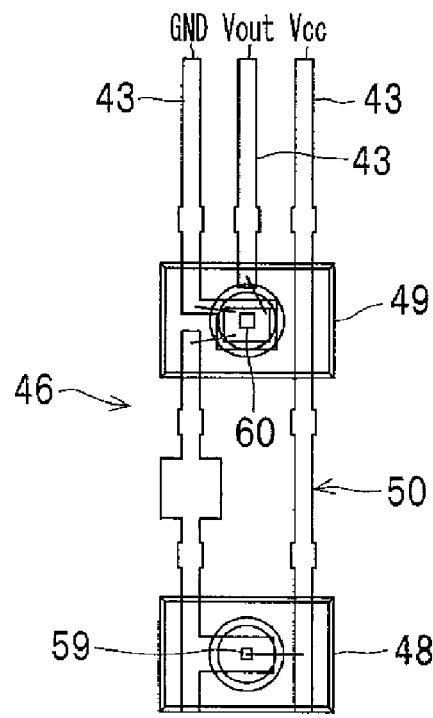
FIG. 3 is a view showing the construction of the device unit in FIGS. 2A and 2B.

Next, the device unit 46 is described with reference to FIG. 3. FIG. 3 is a see-through view in which the inside of the mold resin is seen through the portion of the light-shielding resin.

The device unit 46 is obtained by die-bonding a light-emitting chip 59 and a light-receiving chip 60 to the surface of the lead frame 50 formed of an iron alloy or a copper alloy, performing wire bonding of the light-emitting chip 59 and the light-receiving chip 60 with a gold wire or the like and thereafter forming the light-emitting mold portion 48 and the light-receiving mold portion 49 by transfer molding of a translucent resin such as an epoxy resin transparent to the light emitted from the light-emitting chip 59.

Figure 4:
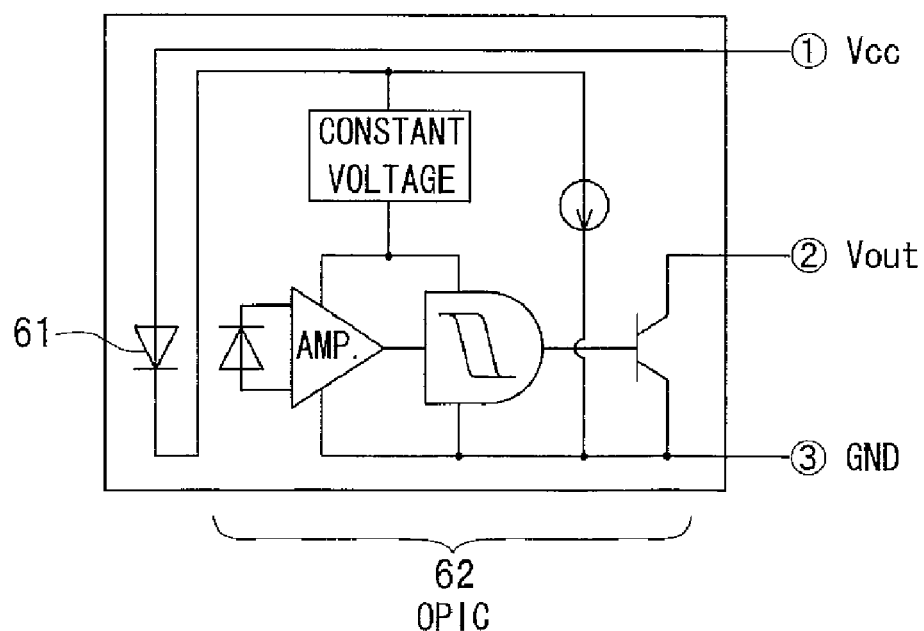
FIG. 4 is a circuit diagram of OPIC (Optical IC) used for the optical coupler shown in FIGS. 1A through 1C.

In this case, the pin arrangement of the device unit 46 shown in FIG. 3 is made to conform to the pin arrangement of a conventional optical coupler that employs an OPIC (optical IC) 62 shown in FIG. 4 that receives light from an LED (light-emitting diode) 61, and the pin arrangement of the external connection terminals 43 has GND, Vout and Vcc from the left-hand side in FIG. 3.

Figure 5A:
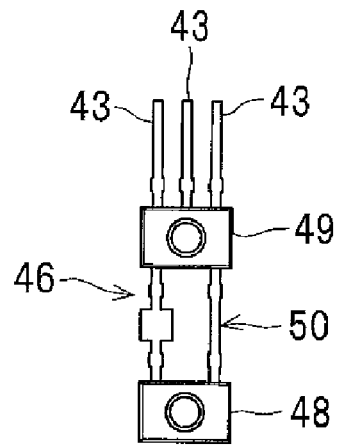
FIGS. 5A and 5B are explanatory views of the formation method of the device unit in FIGS. 2A and 2B.
Figure 5B:
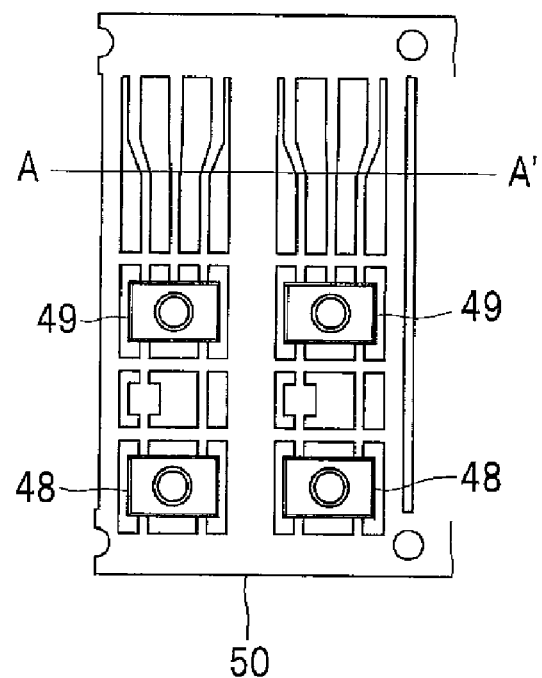

As shown in FIG. 5B, the device unit 46 shown in FIG. 3 is obtained by forming a plurality of sets of light-emitting mold portions 48 and light-receiving mold portions 49 as described above on the lead frame 50 that has a prescribed pattern and thereafter cutting the lead frame 50 by lead cutting in the surroundings of the mold portions 48 and 49 and along a straight line A-A' and finally cutting the lead frame 50 that fixes the surrounding portions is cut for separation into individual devices. Thus, as shown in FIG. 5A, the device unit 46 on which the light-emitting mold portion 48 and the light-receiving mold portion 49 are mounted is obtained.

In the optical coupler having the above construction, the portions of the light-emitting mold portion 48 and the light-receiving mold portion 49 of the device unit 46 on the lower side of the lead frame 50 are fit into the light-emitting side recess portion 57 and the light-receiving side recess portion 58 of the lower casing 47, and the device unit 46 is placed on the lower casing 47 with the external connection terminals 43 constructed of one end portion of the lead frame 50 positioned at the lower connector portion 42b of the lower casing 47. Thereafter, the upper casing 45 is placed on the device unit 46 so that the light-emitting device housing chamber 52 and the light-receiving device housing chamber 54 of the upper casing 45 are positioned at the light-emitting mold portion 48 and the light-receiving mold portion 49 of the device unit 46 above the upper side of the lead frame 50, and the upper connector portion 42a of the upper casing 45 is positioned at the external connection terminals 43 constructed of the one end portion of the lead frame 50. Then, the upper casing 45 is pressed against the lower casing 47.

Thus, by engaging the fixing claw 55 of the lower casing 47 with the engagement hole 56 of the upper casing 45, the upper casing 45 and the lower casing 47 are firmly joined together in a state in which the device unit 46 is placed between them, forming the exterior casing 41 and the connector portion 42. In this case, the structures, the positions and the numbers of the fixing claws 55 and the engagement holes 56 are not limited to those of the present embodiment but allowed to be arbitrarily set.

At the connector portion 42 of the present embodiment, as shown in FIGS. 6A, 6B and FIGS. 7A and 7B, three sets of grooves 64a, 64b through which the three external connection terminals 43 are inserted are provided at an upper connector housing 63a as the first division connector housing of the upper connector portion 42a and at a lower connector housing 63b as the second division connector housing of the lower connector portion 42b. In this case, the outside dimension "L1" of the external connection terminals 43 and the inner diameter dimension "C1" of the grooves 64a, 64b are set so that the relation: "C1≧L1" holds.

Figure 8A:
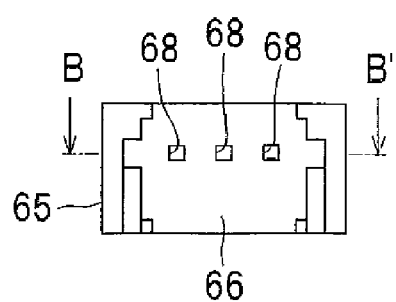
FIGS. 8A and 8B are explanatory views of a structure for attaching a conventional device unit to a connector portion.
Figure 8B:
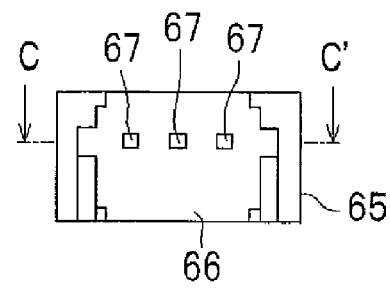
Figure 9A:
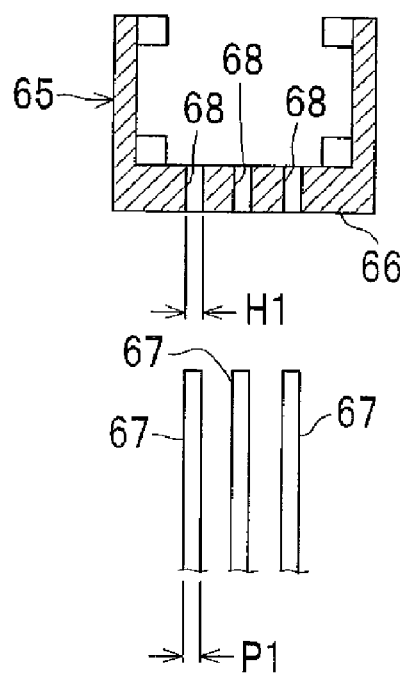
FIGS. 9A and 9B are explanatory views of the attaching structure following FIGS. 8A and 8B.
Figure 9B:
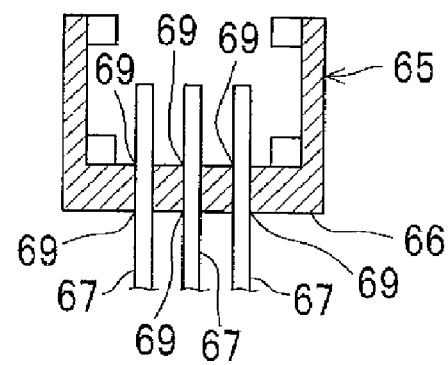

FIGS. 8A and 8B show front views of a conventional connector portion 65. FIGS. 9A and 9B are sectional views taken along the arrow lines B-B' of FIGS. 8A and C-C' of FIG. 5B, respectively. Through holes 68 through which the external connection terminals 67 are inserted are provided at a connector housing 66 of the connector portion 65. In this case, FIGS. 8A and 9A show a state before the external connection terminals 67 are inserted into the through holes 68, and FIGS. 8B and 9B show a state after the external connection terminals 67 have been inserted into the through holes 68. At the conventional connector portion 65, the external connection terminals 67 are inserted into the through holes 68 by press fitting. Therefore, when there is a relation: "H1<P1" between the outside dimension "P1" of the external connection terminals 67 and the inner diameter dimension "H1" of the through holes 68, a pressure is applied to the external connection terminals 67 at boundaries 69 between the external connection terminals 67 and the through holes 68 to generate whiskers.

Figure 6A:
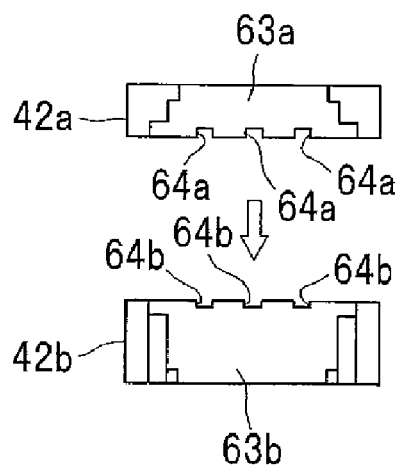
FIGS. 6A and 6B are explanatory views of a structure for attaching the device unit in FIGS. 2A and 2B to the connector portion.
Figure 6B:
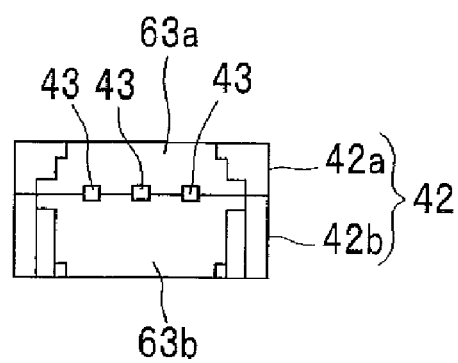
Figure 7A:
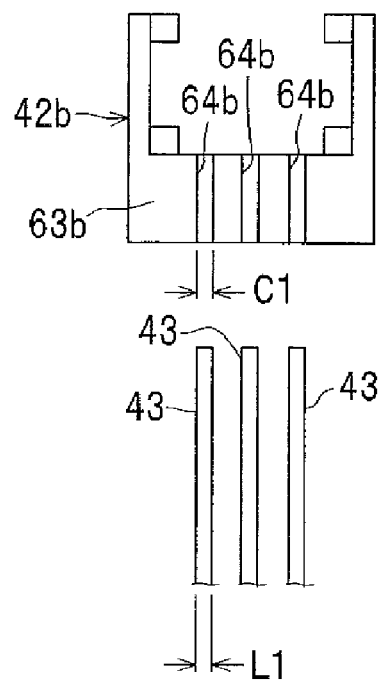
FIGS. 7A and 7B are explanatory views of the attaching structure following FIGS. 6A and 6B.
Figure 7B:
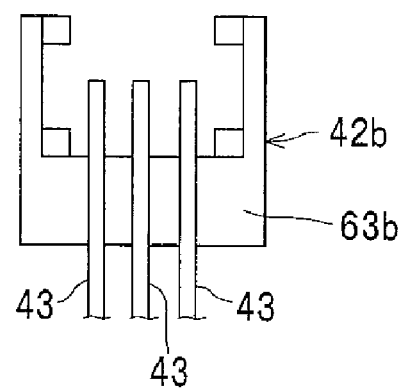

In contrast to this, in the present embodiment, there is the relation: "C1≧L1" between the outside dimension "L1" of the external connection terminals 43 and the inner diameter dimension "C1" of the grooves 64a, 64b, and the external connection terminals 43 are fit to the connector portion 42 by holding the external connection terminals 43 by the upper connector portion 42a and the lower connector portion 42b. FIGS. 6A and 7A show a state before the external connection terminals 43 are inserted into the grooves 64a, 64b (before the connector portion 42 is assembled), and FIGS. 6B and 7B show a state after the external connection terminals 43 have been inserted into the grooves 64a, 64b (after the connector portion 42 has been assembled). Therefore, since a gap is generated between the grooves 64a, 64b and the external connection terminals 43, no pressure is applied to the external connection terminals 43 by the grooves 64a, 64b, and the generation of a whisker can be suppressed.

Figure 2A:
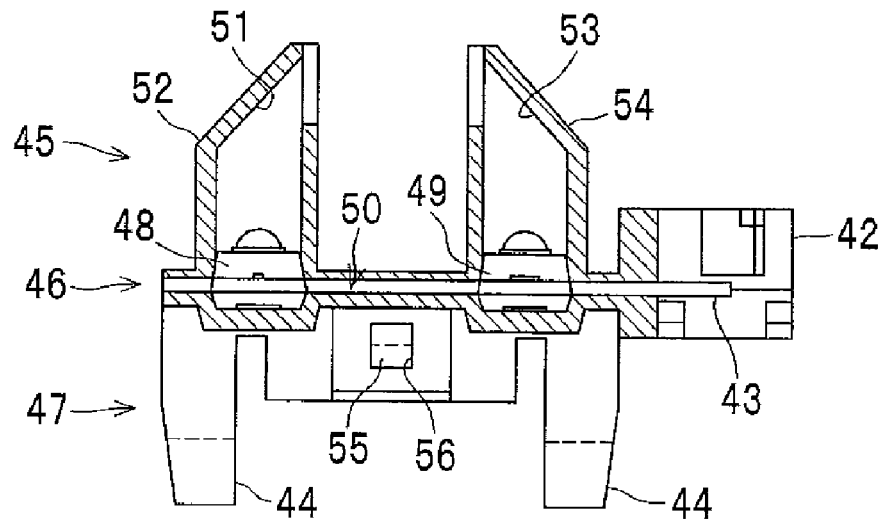
FIGS. 2A and 2B are views showing cross sections of the optical coupler shown in FIGS. 1A through 1C.
Figure 2B:
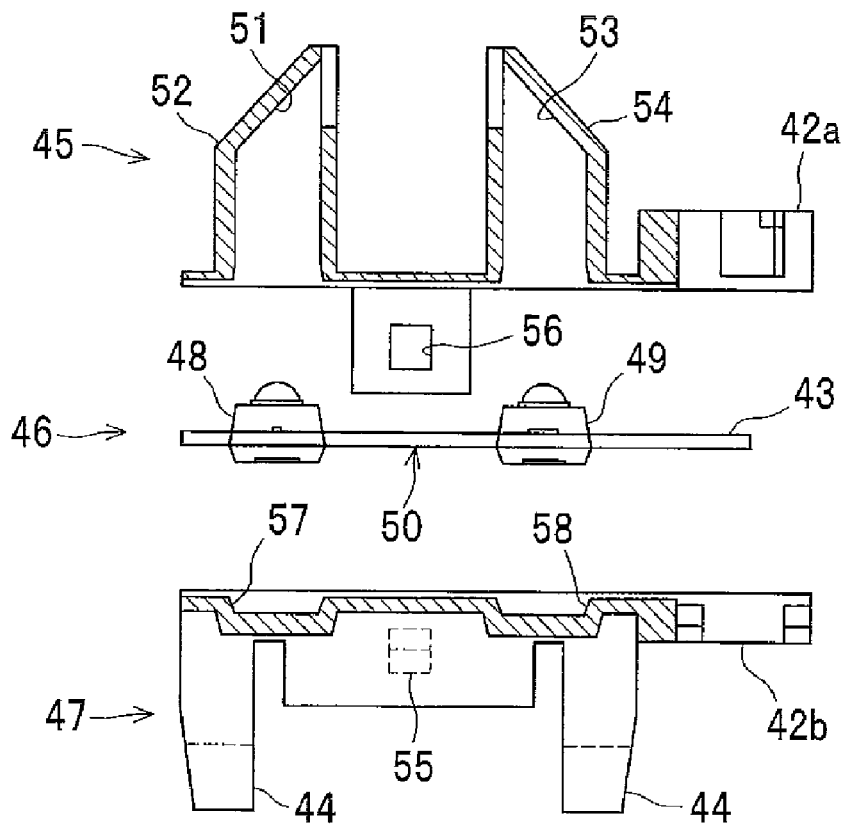

In this case, although the gap is generated between the grooves 64a, 64b and the external connection terminals 43, no significant looseness that practically poses a problem occurs since the lead frame 50 continuous to the external connection terminals 43 is fixed held by the upper casing 45 and the lower casing 47 as shown in FIG. 2A.

As described above, in the present embodiment, the exterior casing 41 that houses the device unit 46 including the lead frame 50 on which the light-emitting mold portion 48 and the light-receiving mold portion 49 are mounted can be divided into the upper casing 45 and the lower casing 47, constituting the exterior casing 41 of two parts. Thus, by holding the lead frame 50 by the upper casing 45 and the lower casing 47, the external connection terminals 43 constructed of the one end portion of the lead frame 50 can be constructed so as to be fixed to the exterior casing 41 and positioned in the connector portion 42.

Therefore, the parts count is reduced to three according to the present embodiment. Furthermore, the upper casing 45 and the lower casing 47 can be fixed by the fixed fitting mechanism without performing any of welding, soldering, and thermal caulking unlike the conventional optical coupler disclosed in JP3176496 and the optical semiconductor device disclosed in H08-125218 A, and the assembling becomes easy.

The Second Embodiment

Figure 10A:
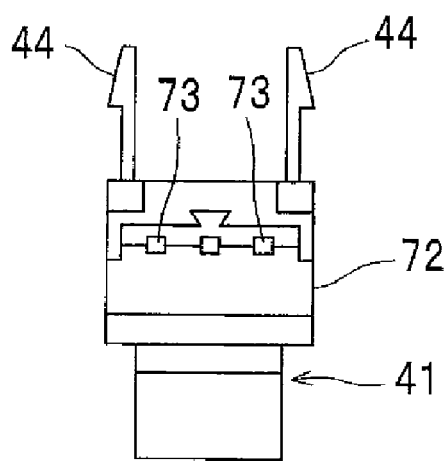
FIGS. 10A through 10C are views showing the construction of the optical coupler different from FIGS. 1A through 1C.
Figure 10B:
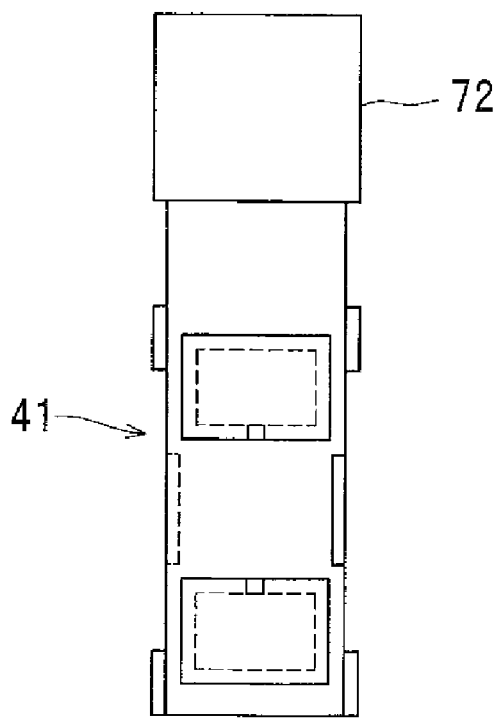
Figure 10C:
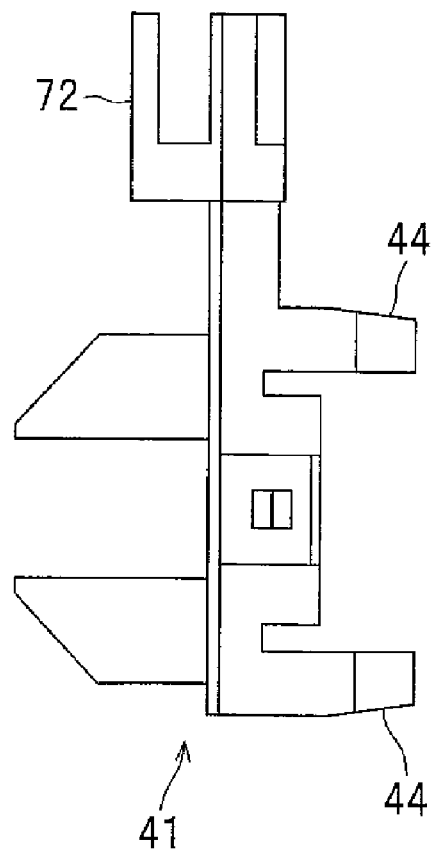
Figure 11A:
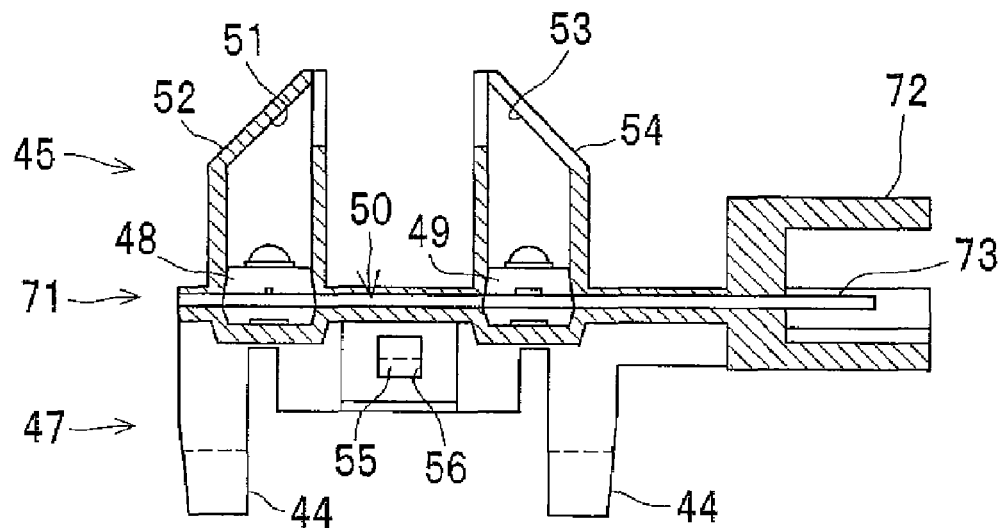
FIGS. 11A and 11B are views showing cross sections of the optical coupler shown in FIGS. 10A through 10c.
Figure 11B:
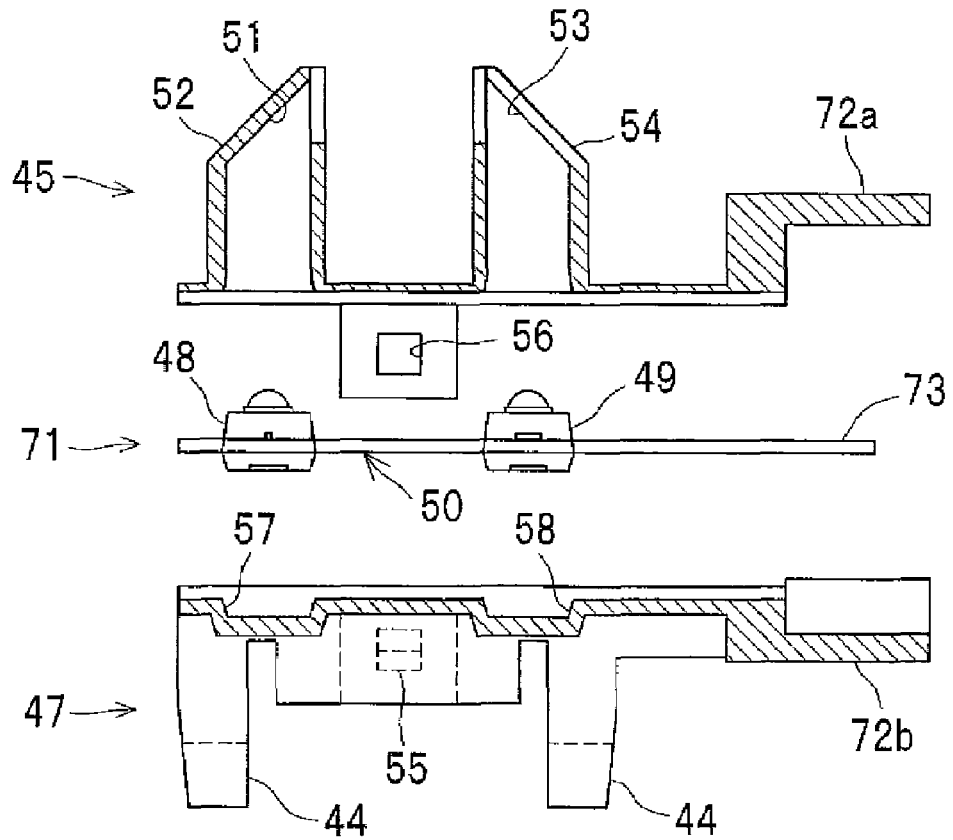

FIGS. 10A through 10C are views showing the construction of the optical coupler of the present embodiment. FIG. 10A is a front view, FIG. 10B is a top view, and FIG. 10C is a side view. FIG. 11 shows a cross section of the optical coupler shown in FIG. 10.

The optical coupler of the present embodiment differs from the optical coupler of the first embodiment only in the external connection terminals of the device unit and the connector portion. The members other than the external connection terminals of the device unit and the connector portion are denoted by the same reference numerals as those of the optical coupler of the first embodiment shown in FIGS. 1A through 1C and FIGS. 2A and 2B, and no detailed description is provided therefor.

Figure 12:
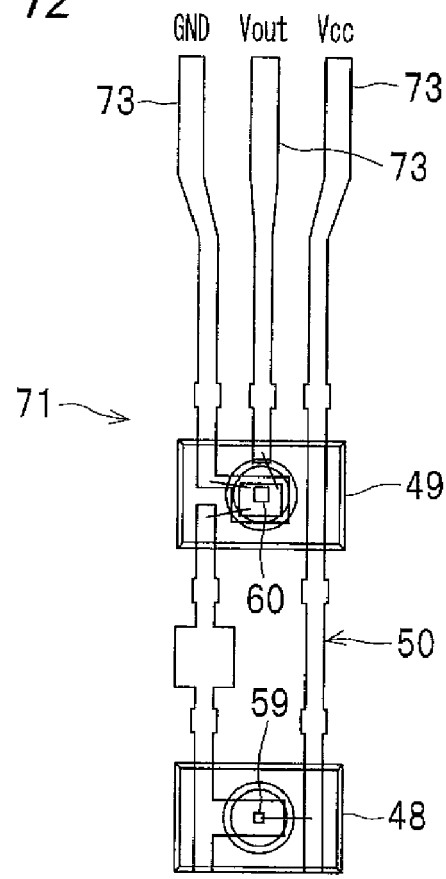
FIG. 12 is a view showing the construction of the device unit in FIGS. 11A and 11B.

External connection terminals 43 having an array pitch of 1.5 mm are provided at an end portion of the connector portion 42 of the device unit 46 of the first embodiment. In contrast to this, external connection terminals 73 having an array pitch of 2 mm are provided at an end portion on a connector portion 72 side of a device unit 71 of the present embodiment as shown in FIG. 12. As a result, the connector portion 72 of the present embodiment is larger than the connector portion 42 of the first embodiment and also has a different structure.

As shown in FIG. 12 (see-through view), in the device unit 71 of the present embodiment, after die-bonding a light-emitting chip 59 and a light-receiving chip 60 to the surface of the lead frame 50 formed of an iron alloy or a copper alloy and performing wire bonding of the light-emitting chip 59 and the light-receiving chip 60 with a gold wire or the like, the light-emitting mold portion 48 and the light-receiving mold portion 49 are formed by transfer molding of a translucent resin such as epoxy resin transparent to the light emitted from the light-emitting chip 59. It is noted that the interval of the portions of the external connection terminals 73 is expanded, so that the array pitch is 2 mm as described above.

Figure 13A:
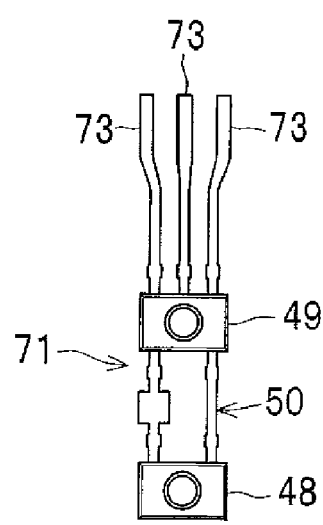
FIGS. 13A and 13B are explanatory views of the formation method of the device unit in FIG. 12.
Figure 13B:
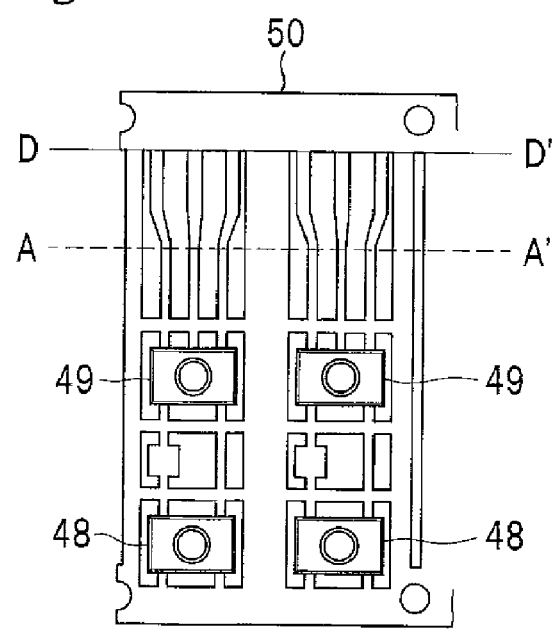

The device unit 71 of the above construction is formed as follows. As shown in FIG. 13B, after a plurality of sets of the light-emitting mold portion 48 and the light-receiving mold portion 49 are formed on a lead frame 50 that has quite the same pattern as that of the first embodiment, the lead frame 50 is cut by lead cutting in the surroundings of the mold portions 48 and 49 and in a position of a straight line D-D', and finally the lead frame 50 that fixes the surrounding portions is cut for separation into individual devices. Thus, the device unit 71 on which the light-emitting mold portion 48 and the light-receiving mold portion 49 are mounted is obtained as shown in FIG. 13A.

In the above case, in contrast to the fact that the pattern of the lead frame 50 before the lead cutting has an array pitch of 1.5 mm on the light-receiving mold portion 49 side within the dashed line A-A' at the portion of the external connection terminals 73, the array pitch is expanded on the peripheral side without the dashed line A-A' to result in an array pitch of 2 mm on the extremity side. The pattern of the lead frame 50 as described above is quite the same as in the case of the first embodiment. When the lead frame 50 is cut in the position of the dashed line A-A' (i.e., the position of the straight line A-A' in FIG. 5B) at the time of the lead cutting, a device unit 46 that has external connection terminals 43 having the array pitch of 1.5 mm in the first embodiment is formed. When the lead frame 50 is cut in the position of the straight line D-D', a device unit 71 that has external connection terminals 43 having the array pitch of 2 mm in the present embodiment is formed.

As described above, in the present embodiment, the pattern of the lead frame 50 before the lead cutting is made to have array pitches varied depending on the light-receiving mold portion 49 side within the dashed line A-A' and on the peripheral side without the dashed line A-A' at the portion of the external connection terminals. Therefore, the device unit that has external connection terminals of which the array pitch is varied depending on the case where the lead frame 50 is cut in the position of the dashed line A-A' and the case where the lead frame 50 is cut in the position of the straight line D-D' in the peripheral portions can be formed.

Therefore, the device units 46, 71 of different kinds can be manufactured from the identical lead frame 50, and this not only facilitates the recovery of the investment of the manufacturing apparatus by sharing the manufacturing apparatus for different external connection terminals but also allows the obtainment of great advantages in terms of production control and manufacturing control.

In this case, the present embodiment also has the relation: "C1≧L1" between the outside dimension "L1" of the external connection terminals 73 and the inner diameter dimension "C1" of the grooves in which the external connection terminals 73 are inserted, and the external connection terminals 73 are set in the connector portion 72 by holding the external connection terminals 73 by an upper connector portion 72a and a lower connector portion 72b as in the case of the first embodiment. Accordingly, since a gap is generated between the grooves and the external connection terminals 73, no pressure is applied to the external connection terminals 73 by the grooves, and the generation of a whisker can be suppressed.

In the second embodiment, the pattern of the lead frame 50 before the lead cutting is changed in two steps at the portion of the external connection terminals 73 so as to be able to cope with the opposite connectors of two kinds of pitches. However, the present invention is not limited to this but allowed to cope with the opposite connectors of three or more kinds of pitches by changing the array pitch in three or more steps if there is a margin in the length of the external connection terminals 73.

The Third Embodiment

Figure 14:
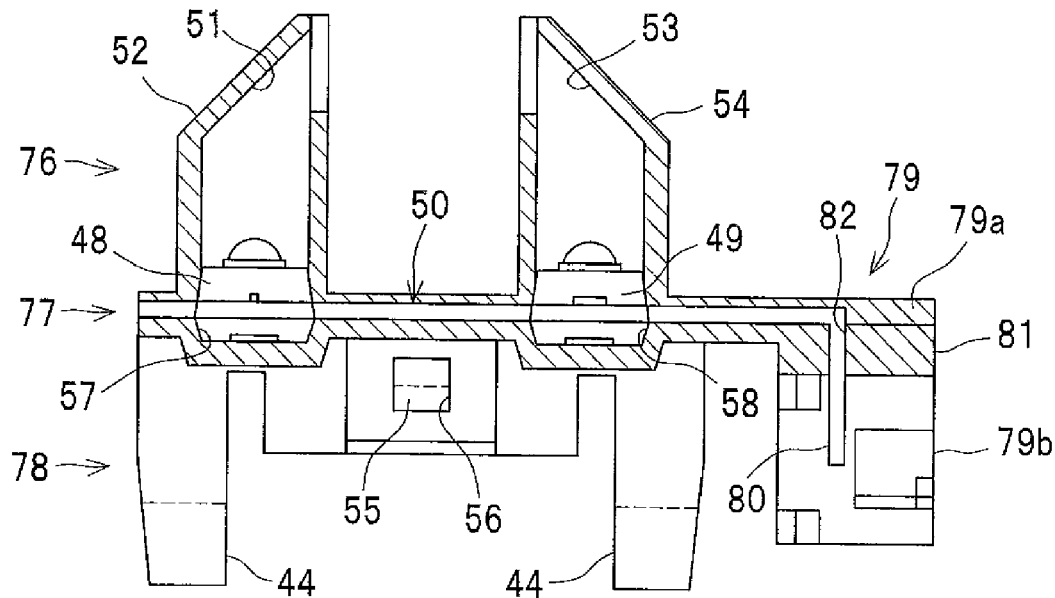
FIG. 14 is a view showing cross sections of the optical coupler different from FIGS. 1A through 1C and FIGS. 10A through 10C.

FIG. 14 is a longitudinal sectional view showing the construction of the optical coupler of the present embodiment.

The optical coupler of the present embodiment differs from the optical coupler of the first embodiment only in the connector portion of the exterior casing and the external connection terminals. Therefore, the other members are denoted by the same reference numerals as in the case of the optical coupler of the first embodiment shown in FIGS. 1A through 1C and FIGS. 2A and 2B, and no detailed description is provided therefor.

External connection terminals 80 in the present embodiment are bent on the side opposite from the light-emitting surface of the light-emitting mold portion 48 generally perpendicularly to the main body of the lead frame 50. Moreover, a connector portion 79 is formed extending on the side opposite from the light-emitting surface of the light-emitting mold portion 48 with respect to the main body of the lead frame 50.

That is, a lower connector portion 79b constituting the connector portion 79 and formed integrally with a lower casing 78 is formed extending along the external connection terminals 80 and constitutes generally the whole of the connector portion 79. Then, through holes 82 in which the external connection terminals 80 are inserted in the perpendicular direction are provided at a lower connector housing 81 of the lower connector portion 79b. On the other hand, an upper connector portion 79a constituting the connector portion 79 and formed integrally with an upper casing 76 is constructed of an upper connector housing constructed simply of a flat plate that pressurizes the external connection terminals 80 while being fit closely to the lower connector housing 81.

Figure 15:
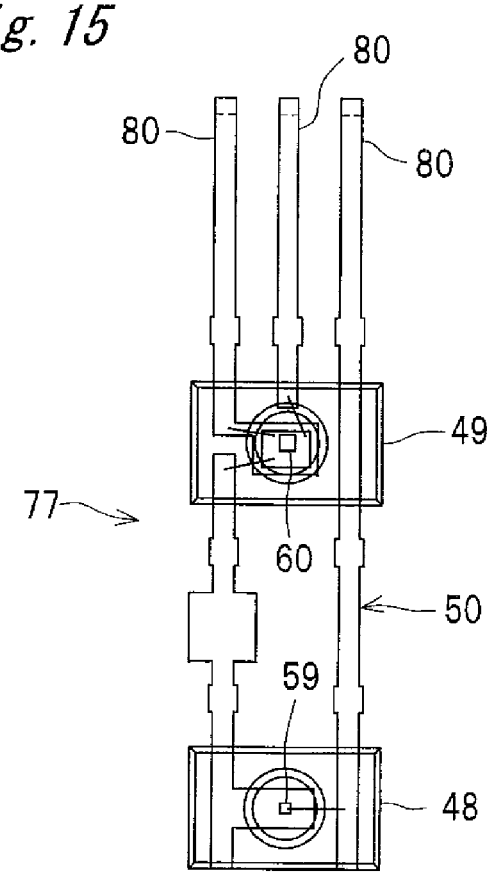
FIG. 15 is a view showing the construction of the device unit in FIG. 14.

In the device unit 77 of the present embodiment, as shown in FIG. 15 (see-through view), after die-bonding a light-emitting chip 59 and a light-receiving chip 60 to the surface of the lead frame 50 formed of an iron alloy or a copper alloy and performing wire bonding of the light-emitting chip 59 and the light-receiving chip 60 with a gold wire or the like, the light-emitting mold portion 48 and the light-receiving mold portion 49 are formed by transfer molding of a translucent resin such as epoxy resin transparent to the light emitted from the light-emitting chip 59. It is noted that the portion of the external connection terminals 80 is formed straightly with an array pitch of 1.5 mm.

Figure 16A:
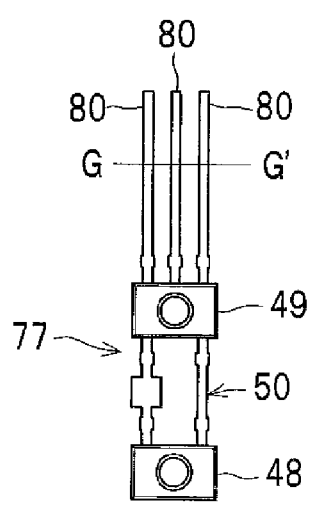
FIGS. 16A and 16B are explanatory views of the formation method of the device unit in FIG. 15.
Figure 16B:
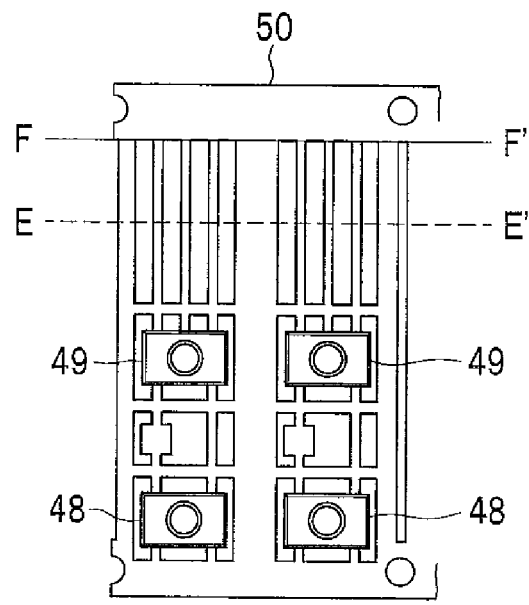

The device unit 77 of the above construction is formed as follows. As shown in FIG. 16B, after a plurality of sets of the light-emitting mold portion 48 and the light-receiving mold portion 49 are formed on the lead frame 50 that has a prescribed pattern, the lead frame 50 is cut in the surroundings of the mold portions 48 and 49 and in a position of a straight line F-F', and finally the lead frame 50 that fixes the surrounding portions is cut for separation into individual devices. Thus, the device unit 77 on which the light-emitting mold portion 48 and the light-receiving mold portion 49 are mounted is obtained as shown in FIG. 16A. Then, by bending the lead frame 50 in the position of a straight line G-G' in FIG. 16A, the device unit 77 as shown in FIGS. 14 and 15 is completed.

In the above case, the pattern of the lead frame 50 before the lead cutting is linearly formed with an array pitch of 1.5 mm at the portion of the external connection terminals 80. When the lead frame 50 is cut in the position of a dashed line E-E' at the time of the lead cutting, the device unit 46 of the first embodiment that has the external connection terminals 43 having the array pitch of 1.5 mm is formed. When the lead frame 50 is cut in the position of the straight line F-F' and bent in the position of the straight line G-G', the device unit 77 of the present embodiment that has the external connection terminals 80 having an array pitch of 1.5 mm and has the external connection terminals 80 bent generally perpendicularly on the side opposite from the light-emitting surface of the light-emitting mold portion 48 is formed.

Therefore, the device units 46, 77 of different kinds can be manufactured from the identical lead frame 50, and this not only facilitates the recovery of the investment of the manufacturing apparatus by sharing the manufacturing apparatus for different external connection terminals but also allows the obtainment of great advantages in terms of production control and manufacturing control.

The present embodiment also has the relation: "C1≧L1" between the outside dimension "L1" of the external connection terminals 80 and the inner diameter dimension "C1" of the through holes 82 provided at the lower connector housing 81, and the external connection terminals 50 are set in the connector portion 79 by inserting the external connection terminals 80 into the through holes 82 of the lower connector housing 81. Therefore, since a gap is generated between the through holes 82 and the external connection terminals 80, no pressure is applied to the external connection terminals 80 by the through holes 82, and the generation of a whisker can be suppressed.

Moreover, although the gap is generated between the through holes 82 and the external connection terminals 80 as described above, no significant looseness that practically poses a problem occurs since the lead frame 50 continuous to the external connection terminals 80 is fixed held by the upper casing 76 and the lower casing 78 as shown in FIG. 14.

The Fourth Embodiment

The present embodiment is related to a structure for setting the external connection terminals in the connector portion.

Figure 17A:
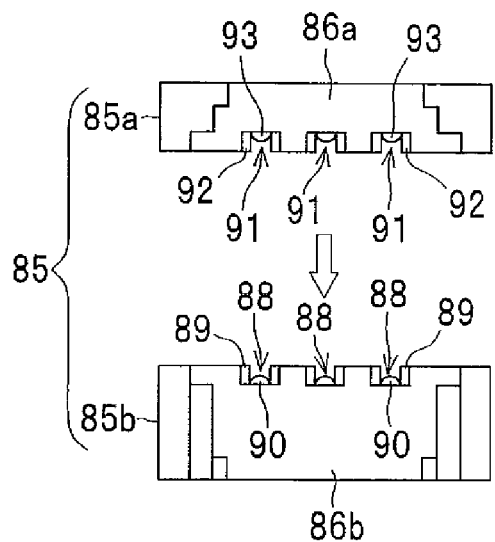
FIGS. 17A and 17B are explanatory views of a structure for attaching a device unit to a connector portion different from FIGS. 6A and 6B and FIGS. 7A and 7B.
Figure 17B:
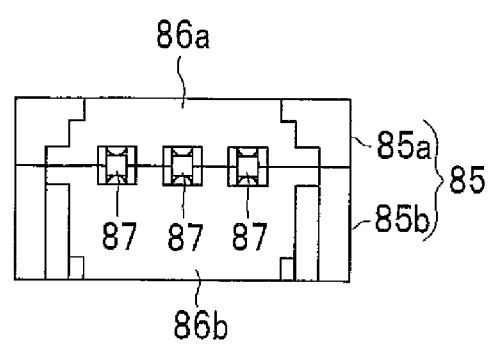
Figure 18A:
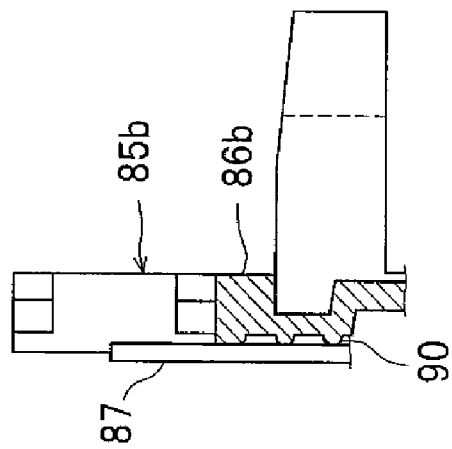
FIGS. 18A through 18C are explanatory views of the attaching structure following FIGS. 17A and 17B.
Figure 18B:
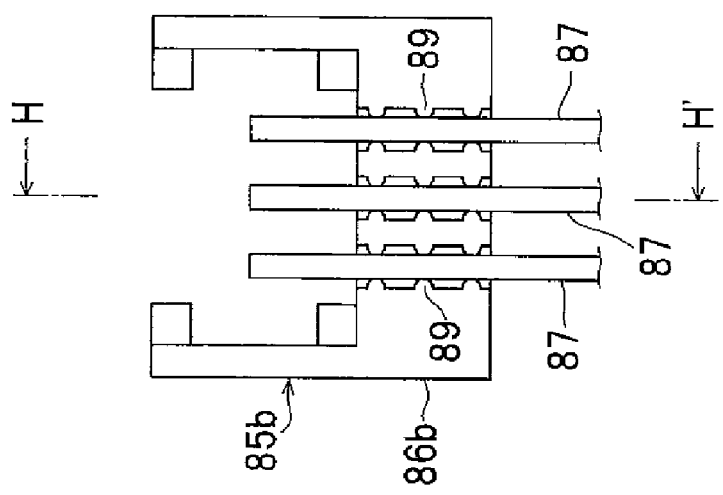
Figure 18C:
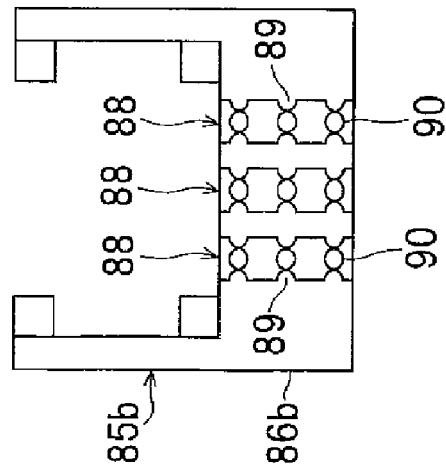

FIGS. 17A and 17B show the construction of a connector portion 85 in the optical coupler of the present embodiment. FIG. 17A shows a state before the connector portion 85 is assembled, and FIG. 17B shows a state after the connector portion 85 has been assembled. FIGS. 18A and 18B show plan views of a lower connector portion 85b that constitutes the connector portion 85. FIG. 18A shows a state before the connector portion 85 is assembled, FIG. 18B shows a state after the assembling, and FIG. 18C is a sectional view taken along the arrow line H-H' of FIG. 18B.

The optical coupler of the present embodiment differs from the optical coupler of the first embodiment only in the connector portion 85, and no description is provided for the components other than the connector portion 85.

As shown in FIGS. 17A and 17D and FIGS. 18A, 18B and 18C, three grooves 88 in which three external connection terminals 87 are inserted are provided at a lower connector housing 86b of the lower connector portion 85b. Then, cylindrical projections 89 projecting in a cylindrical shape and hemispherical projections 90 projecting in a hemispherical shape are formed on inner walls of the grooves 88. Moreover, as shown in FIG. 17A, three grooves 91 in which cylindrical projections 92 and hemispherical projections 93 are formed are provided at an upper connector housing 86a of an upper connector portion 85a in positions opposite to the grooves 88 on the lower connector portion 85b side as in the case of the lower connector portion 85b.

Then, external connection terminals 87 are inserted in the through holes formed of the grooves 88 and the grooves 91 as in the case of the first embodiment. In this case, the cylindrical projections 89, 92 and the hemispherical projections 90, 93 are elastically deformed to hold the external connection terminals 87 therebetween. Therefore, no gap is generated between the connector housings 86a, 86b and the external connection terminals 87 unlike the case of the first embodiment, so that the external connection terminals 87 can be fixed to the connector portion 85 without looseness.

Further, the places of the external connection terminals 87 where pressures are applied ought to be the places of the cylindrical projections 89, 92 and the hemispherical projections 90, 93. Therefore, even if a whisker is generated, the whisker falls within the grooves 88, 91, and the occurrence of an electric shortcircuit attributed to the generated whisker can be suppressed.

The Fifth Embodiment

The present embodiment is related to an optical coupler that has two connector portions.

Figure 19A:
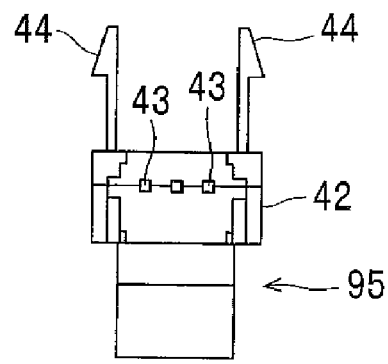
FIGS. 19A through 19D are views showing the construction of the optical coupler different from FIGS. 1A through 1C, FIGS. 10A through 10C and FIG. 14.
Figure 19B:
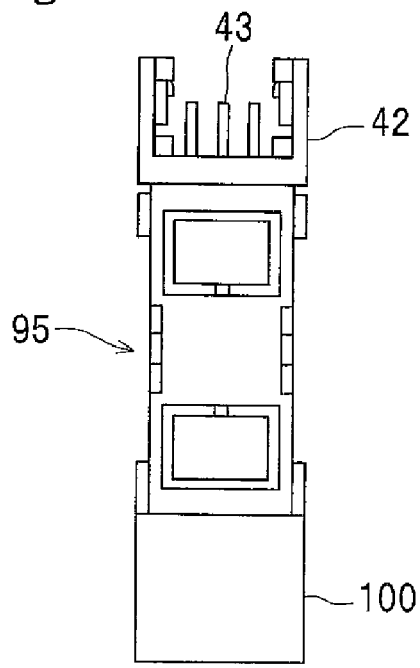
Figure 19D:
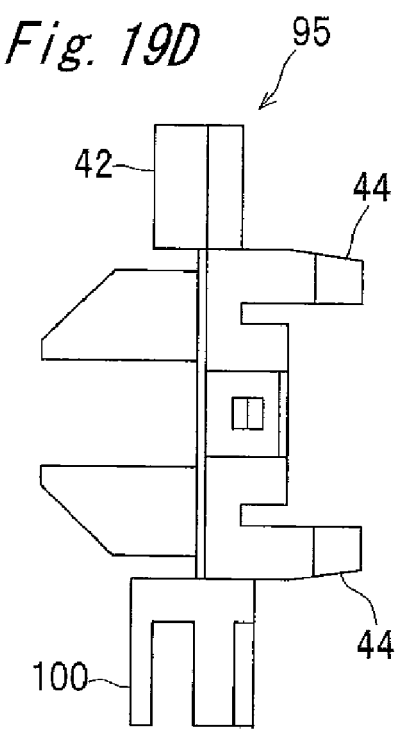
Figure 19C:
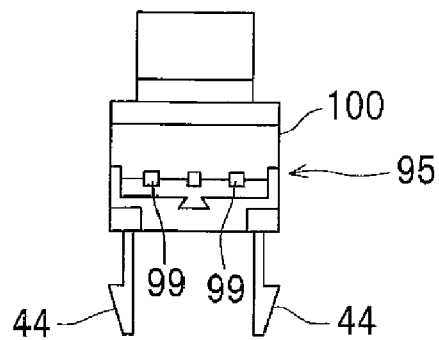
Figure 20:
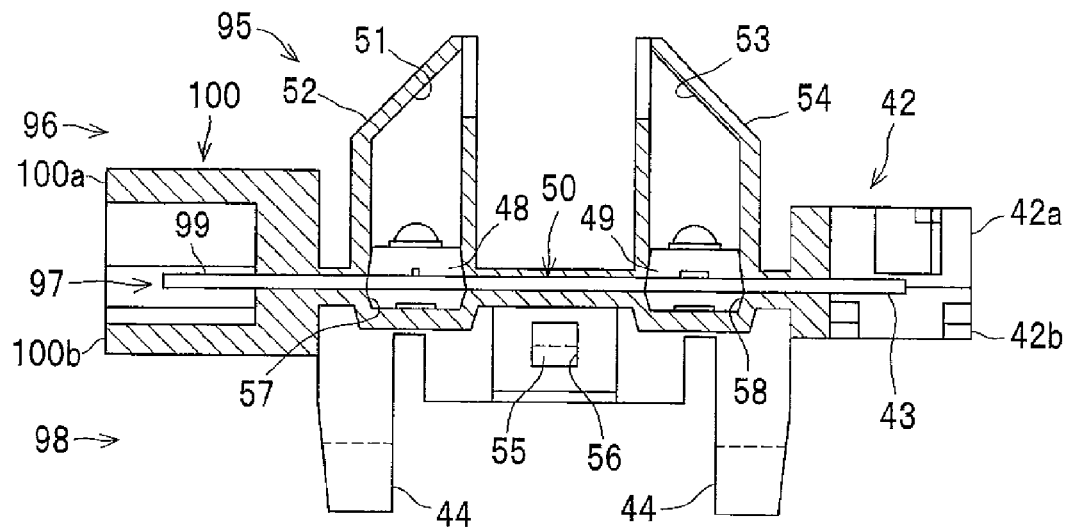
FIG. 20 is a view showing cross sections of the optical coupler shown in FIGS. 19A through 19D.

FIGS. 19A through 19D are views showing the construction of the optical coupler of the present embodiment. FIG. 19A is a front view, FIG. 19B is a top view, FIG. 19C is a rear view, and FIG. 19D is a side view. FIG. 20 shows a cross section of the optical coupler shown in FIG. 19.

The optical coupler of the present embodiment differs from the optical coupler of the first embodiment only in that a connector portion is provided also on a back surface portion in addition to the front portion of the device unit. The members other than the second connector portion provided on the back surface portion of the device unit are denoted by the same reference numerals as in the case of the optical coupler of the first embodiment shown in FIGS. 1A through 1C and FIGS. 2A and 2B, and no detailed description is provided therefor.

An exterior casing 95 of the present embodiment is also formed in a manner that an upper casing 96 made of a light-shielding resin at which an upper connector portion 42a, a light-emitting device housing chamber 52, a light-receiving device housing chamber 54 and an engagement hole 56 are formed and a lower casing 98 made of a light-shielding resin at which a lower connector portion 42b, fitting feet 44, a fixing claw 55, a light-emitting side recess portion 57 and a light-receiving side recess portion 58 are formed are integrally joined together with a device unit 97 interposed therebetween, wherein the device unit 97 includes the lead frame 50 on which the light-emitting mold portion 48 and the light-receiving mold portion 49 are mounted and at which the external connection terminals 43 is formed as in the case of the optical coupler of the first embodiment.

In the present embodiment, the external connection terminals 43 are provided at an end portion on the connector portion 42 side of the device unit 97. On the other hand, external connection terminals 99 are provided at the end portion on the side opposite from the connector portion 42. Then, a connector portion 100 that has the same structure as that of the connector portion 72 of the second embodiment are formed on the external connection terminals 99 side of the exterior casing 95. The connector portion 100 can also be divided into an upper connector portion 100a formed integrally with the upper casing 96 and a lower connector portion 100b formed integrally with the lower casing 98. Hereinafter, in the present embodiment, the external connection terminals 43 are referred to as the first external connection terminals 43, the connector portion 42 is referred to as the first connector portion 42, the upper connector portion 42a is referred to as the first upper connector portion 42a, and the lower connector portion 42b is referred to as the first lower connector portion 42b. Further, the external connection terminals 99 are referred to as the second external connection terminals 99, the connector portion 100 is referred to as the second connector portion 100, the upper connector portion 100a is referred to as the second upper connector portion 100a, and the lower connector portion 100b is referred to as the second lower connector portion 100b.

Figure 21:
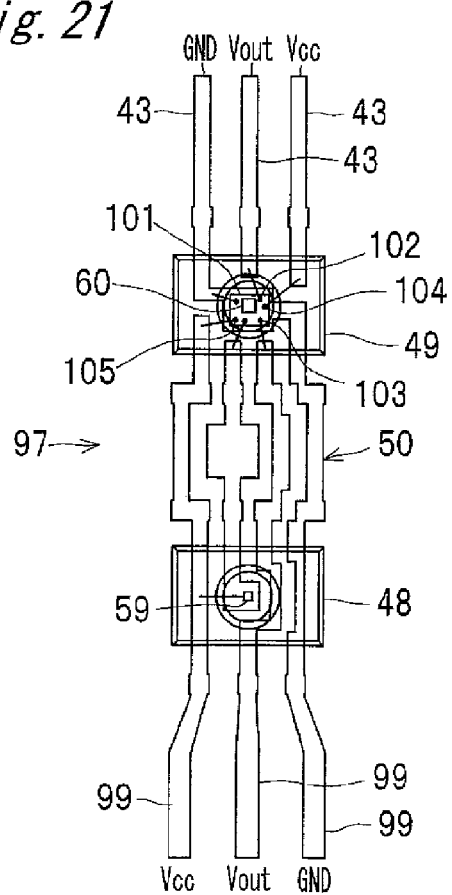
FIG. 21 is a view showing the construction of the device unit in FIG. 20.

As shown in FIG. 21 (see-through view), in the device unit 97 of the present embodiment, after die-bonding a light-emitting chip 59 and a light-receiving chip 60 to the surface of the lead frame 50 formed of an iron alloy or a copper alloy and performing wire bonding of the light-emitting chip 59 and the light-receiving chip 60 with a gold wire or the like, the light-emitting mold portion 48 and the light-receiving mold portion 49 are formed by transfer molding of a translucent resin such as epoxy resin transparent to the light emitted from the light-emitting chip 59. It is noted that the portion of the first external connection terminals 43 has an array pitch of 1.5 mm as in the case of the first embodiment. In contrast to this, the portion of the second external connection terminals 99 has an expanded interval, so that the array pitch is 2 mm as in the case of the second embodiment.

In this case, although the pin arrangement of the first external connection terminals 43 and the pin arrangement of the second external connection terminals 99 are point symmetrical in FIG. 21, the same pin arrangement (in the order of GND, Vout and VCC from the right-hand side when viewed from the extremity side of the external connection terminals 43, 99) is provided when viewed from a female type connector to be connected to the first connector portion 42 and a female type connector to be connected to the second connector portion 100. Although there is no standard of the pin arrangement, it is the current situation that the same pin arrangement is provided by any manufacturer for optical couplers that have same connector portions for the replacement demand.

Moreover, in FIGS. 20 and 21, the first external connection terminals 43, the main body of the lead frame 50 and the second external connection terminals 99 extend in a straight line. However, the present invention is not limited to this, and either one or both of the first external connection terminals 43 and the second external connection terminals 99 may be bent on the side opposite from the light-emitting surface of the light-emitting mold portion 48 generally perpendicularly to the main body of the lead frame 50 as in the case of the third embodiment shown in FIG. 14.

Then, in order to make the pin arrangements of the first connector portion 42 and the second connector portion 100 identical, it is proper to make the pin arrangement of the first external connection terminals 43 and the pin arrangement of the second external connection terminals 99 point symmetrical as described above or make them line symmetrical relative to a straight line that is perpendicular to the direction in which the first external connection terminals 43 and the second external connection terminals 99 extend. In the case of the line symmetry, the female type connector for the first connector portion 42 and the female type connector for the second connector portion 100 having the same pin arrangement are to be inserted vertically inverted.

Hereinafter, internal wiring in the case of the point symmetry is described. If the internal wiring in the case of the point symmetry can be achieved, the internal wiring in the case of the line symmetry can easily be achieved.

With the GND pin of the first external connection terminals 43 formed at one end and the GND pin of the second external connection terminals 99 formed at the other end, the internal wiring of "GND" is provided by the lead frame 50 that penetrates the inside of the light-receiving mold portion 49. The internal wiring of "Vout" is formed by electrically connecting a pad 102 that is connected to the Vout pin of the first external connection terminals 43 with a pad 103 that is connected to the Vout pin of the second external connection terminals 99 on a semiconductor substrate 101 that forms the light-receiving chip 60 in the light-receiving mold portion 49. The internal wiring of "Vcc" is similarly formed by electrically connecting a pad 104 that is connected to the Vcc pin of the first external connection terminals 43 with a pad 105 that is connected to the Vcc pin of the second external connection terminals 99 on the substrate 101. In this case, it is possible to make, for example, Vout of the first connector portion 42 a TTL output and make Vout of the second connector portion 100 an analog output besides the case where the interfaces of the first connector portion 42 and the second connector portion 100 are made identical.

Figure 22:
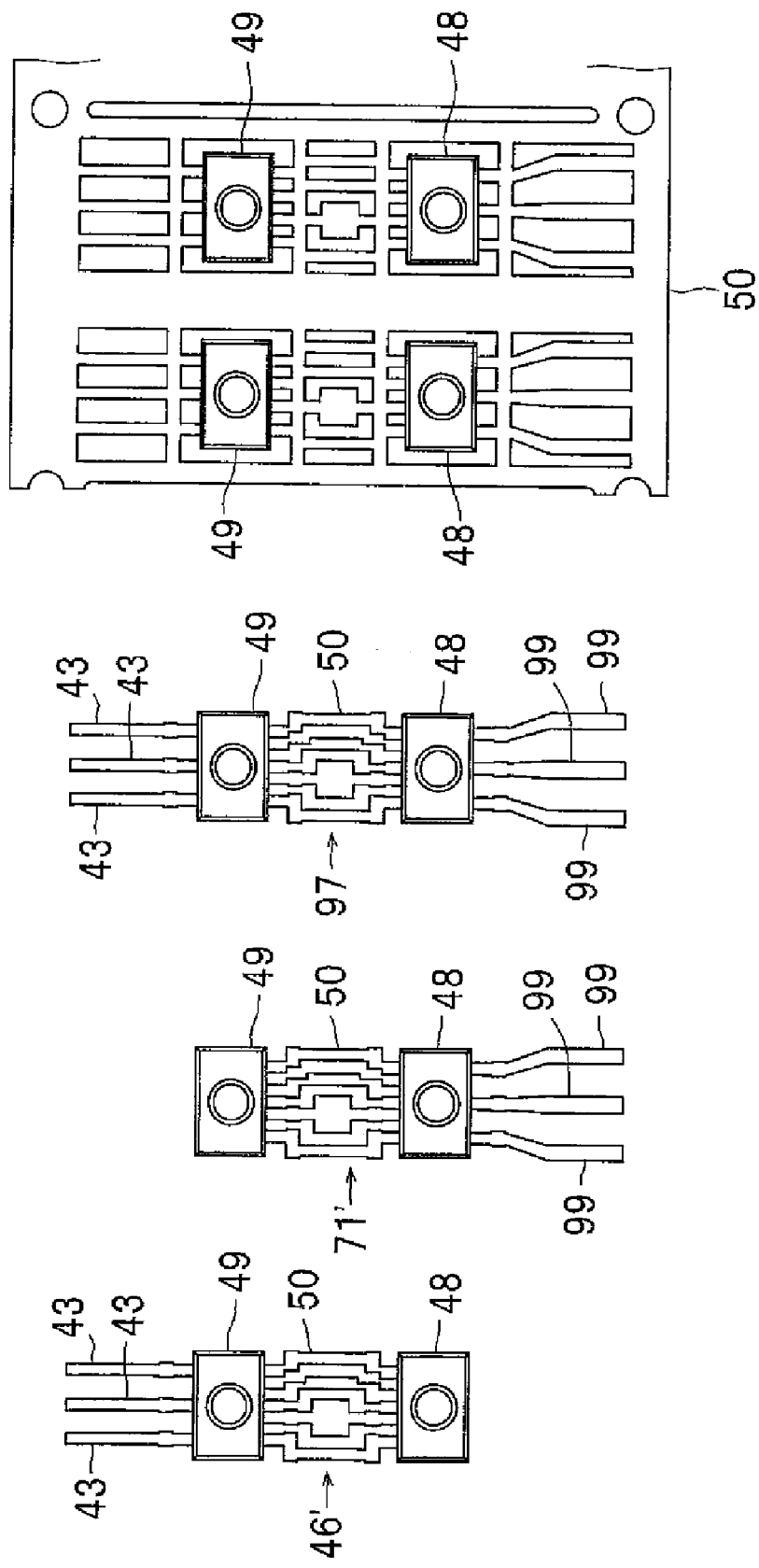
FIGS. 22A through 22D are explanatory views of the formation method of the device unit in FIG. 20.

The device unit 97 of the above construction is formed as follows. As shown in FIG. 22D, after a plurality of sets of the light-emitting mold portions 48 and the light-receiving mold portions 49 are formed on the lead frame 50 that has a prescribed pattern, the lead frame 50 is cut by lead cutting in the surroundings of the molding portions 48, 49 and in the positions of the connection terminals 43 and 99, and finally the lead frame 50 that fixes the surrounding portions is cut for separation into individual devices. Thus, a device unit 97 on which the light-emitting mold portion 48 and the light-receiving mold portion 49 are mounted is obtained as shown in FIG. 22C.

In the above case, in contrast to the fact that the pattern of the lead frame 50 before the lead cutting has the array pitch of 1.5 mm at the portion of the first external connection terminals 43, the array pitch at the portion of the second external connection terminals 99 is 2 mm. Therefore, if the portion of the second external connection terminals 99 is cut off at the time of lead cutting of the lead frame 50 of the pattern, a device unit 461 that has external connection terminals 43 having an array pitch of 1.5 mm in the first embodiment as shown in FIG. 22A is formed. In contrast to this, if the portion of the first external connection terminals 43 is cut off at the time of cutting, a device unit 711 that has external connection terminals 99 having an array pitch of 2 mm in the second embodiment as shown in FIG. 22B is formed. By leaving the first external connection terminals 43 and the second external connection terminals 99 intact at the time of lead cutting, the device unit 97 of the present embodiment that has the first external connection terminals 43 and the second external connection terminals 99 as shown in FIG. 22C is formed.

As described above, in the present embodiment, the first connector portion 42 that has the first external connection terminals 43 having the array pitch of 1.5 mm is provided at one end side as in the case of the first embodiment, and the second connector portion 100 that has the second external connection terminals 99 having the array pitch of 2 mm is provided at the other end side as in the case of the second embodiment. Therefore, by owning one optical coupler of the present embodiment, there is no need to own the two optical couplers of the optical coupler of the first embodiment including the connector portion 42 that has the external connection terminals 43 having the array pitch of 1.5 mm and the optical coupler of the second embodiment including the connector portion 72 that has the external connection terminals 73 having the array pitch of 2 mm.

That is, according to the present embodiment, the kinds of the optical couplers that are varied only in the array pitch of the external connection terminals can be reduced, and the inventory and production control become easy.

Moreover, in the present embodiment, two pads 102, 103 and pads 104, 105 connected to the pins (i.e., the "Vout" and "Vcc" pins) that have the identical function are provided in the light-receiving mold portion 49. Therefore, by electrically connecting the pad 102 with the pad 103 and connecting the pad 104 with the pad 105, it becomes possible to make the pin arrangements of the first connector portion 42 and the second connector portion 100 identical.

In the present embodiment, the first connector portion 42 and the second connector portion 100 have different constructions. However, the present invention is not limited to this, and it is absolutely acceptable to make the first connector portion 42 and the second connector portion 100 have the same construction. When the first connector portion 42 and the second connector portion 100 are made to have the same construction, a daisy chain connection for serially connecting a plurality of peripheral devices becomes easy, and therefore, the construction is most suitable for serial transmission of, for example, the I2C (I square C) standard or the like.

Moreover, although the two pads 102, 103 and the two pads 104, 105 connected to the pins (i.e., the "Vout" and "Vcc" pins) that have the identical function are provided in the light-receiving mold portion 49 in the present embodiment, it is also possible to provide the pads in the light-emitting mold portion 48.

Figure 23:
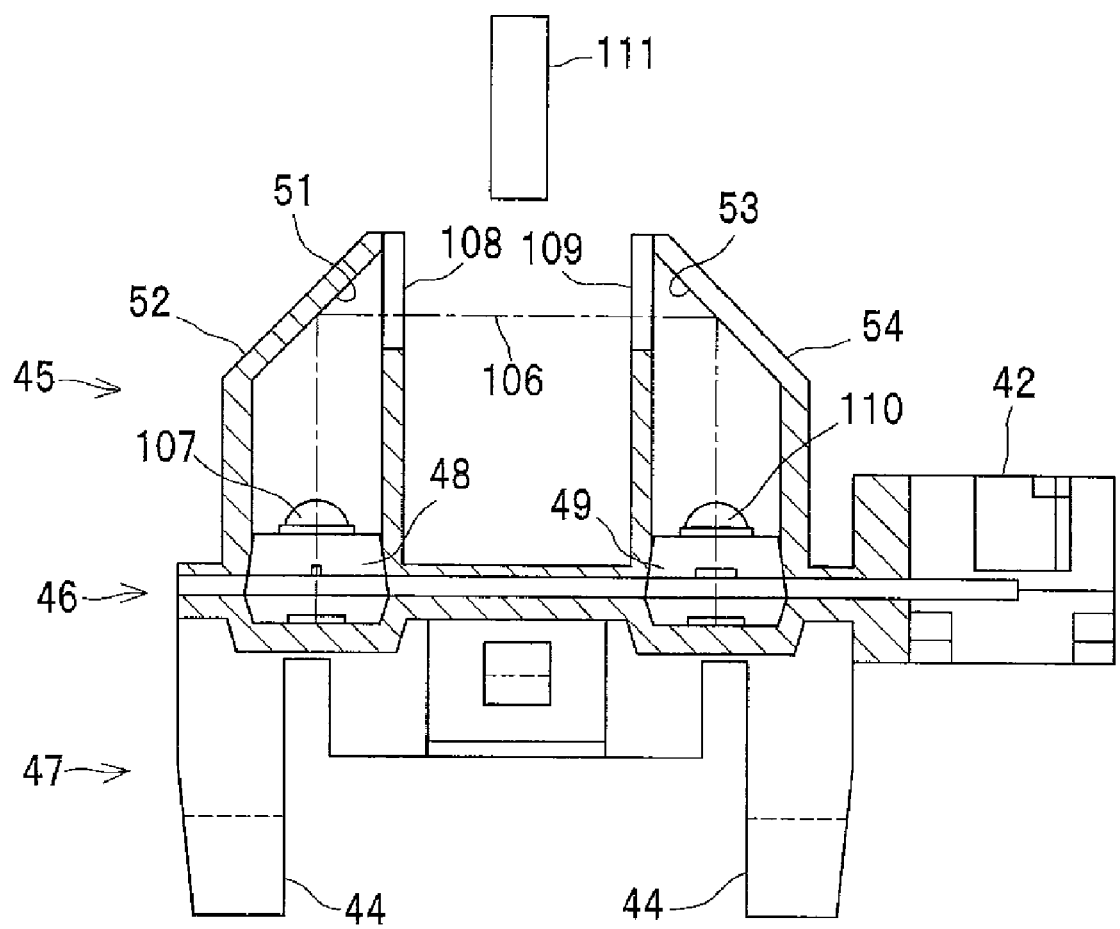
FIG. 23 is an explanatory view of an optical path common to the optical couplers shown in FIGS. 2A and 2B, FIGS. 11A and 11B, FIG. 14 and FIG. 20.

FIG. 23 is a view for explaining an optical path common to the first embodiment (FIGS. 1A through 1C and FIGS. 2A and 2B), the second embodiment (FIGS. 10A through 10C and FIGS. 11A and 11B), the third embodiment (FIG. 14) and the fifth embodiment (FIGS. 19A through 19D and FIG. 20). FIG. 23 is a sectional view of the optical coupler of the first embodiment, and the optical path is described according to the optical coupler of the first embodiment.

In FIG. 23, light emitted from the light-emitting chip 59 in the light-emitting mold portion 48 of the device unit 46 is condensed by the light-emitting side lens 107 provided at the light-emitting mold portion 48 and travels along an optical path 106 toward a first reflecting surface 51 in the light-emitting device housing chamber 52. Then, the light emitted from the first reflecting surface 51 toward the light-receiving device housing chamber 54 is once radiated from a window 108 provided at the light-emitting device housing chamber 52. The light radiated from the window 108 enters the light-receiving device housing chamber 54 from a window 109 provided at the light-receiving device housing chamber 54 and travels toward a second reflecting surface 53 in the light-receiving device housing chamber 54. Then, the light reflected on the second reflecting surface 53 toward the light-receiving mold portion 49 is condensed by a light-receiving side lens 110 provided at the light-receiving mold portion 49 and made incident on the light-receiving chip 60 in the light-receiving mold portion 49.

In the above case, the presence or absence and the passing of a subject (object) 111 to be detected is detected from a change in the quantity of light or the like as a consequence of the interruption of the optical path 106 by the subject (object) 111 to be detected. The optical coupler having the above structure is generally called the light-interrupting type sensor.

Figure 24:
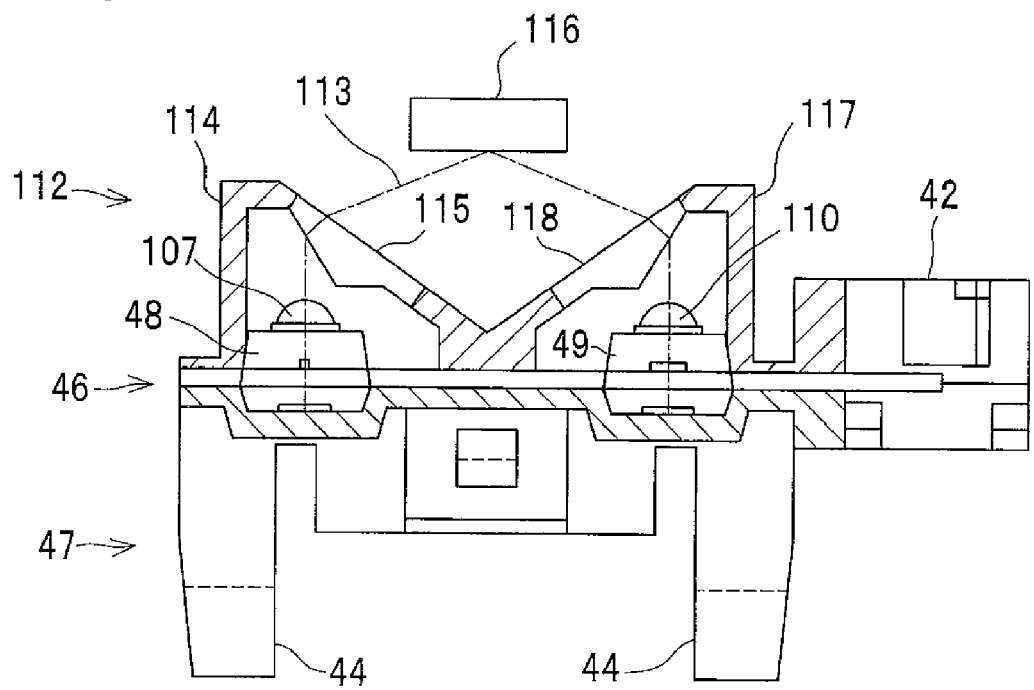
FIG. 24 is a view showing an optical path in a case where the upper casing of the optical coupler shown in FIG. 23 is replaced by an upper casing provided with a prism.

FIG. 24 shows an optical path in a case where the upper casing 45 of the first embodiment is replaced by an upper casing 112 provided with a prism. The members other than the upper casing 112 are denoted by the same reference numerals as in the case of the optical coupler of the first embodiment shown in FIGS. 1A through 1C and FIGS. 2A and 2B, and no detailed description is provided therefor.

In FIG. 24, light emitted from the light-emitting chip 59 in the light-emitting mold portion 48 of the device unit 46 is condensed by the light-emitting side lens 107 provided at the light-emitting mold portion 48 and travels along an optical path 113 toward a first prism 115 in a light-emitting device housing chamber 114. Then, the light is refracted by the first prism 115 and radiated to the outside toward a subject (object) 116 to be detected. The light reflected on the subject (object) 116 to be detected is refracted by a second prism 118 provided at a light-receiving device housing chamber 117 to enter the light-receiving device housing chamber 117 and travels toward the light-receiving mold portion 49 in the light-receiving device housing chamber 117. Then, the light is condensed by a light-receiving side lens 110 provided at the light-receiving mold portion 49 and made incident on the light-receiving chip 60 in the light-receiving mold portion 49.

In the above case, the presence or absence and the passing of the subject (object) 116 to be detected are detected from a change in the quantity of light or the like as a consequence of the reflection of light on the subject (object) 116 to be detected. The optical coupler having the above structure is generally called the light-reflecting type sensor.

Normally, the light-interrupting type sensor and the light-reflecting type sensor are manufactured as different optical couplers. However, according to the present embodiment, it becomes possible to manufacture the light-interrupting type sensor and the light-reflecting type sensor only by replacing the upper casing 45 with the upper casing 112. It is noted that the upper casing 112 provided with the prism can be formed by coinjection molding.

In the example described above, the upper casing 45 of the first embodiment is replaced by the upper casing 112 provided with the prism, it is also possible to replace the upper casings 45, 76, 96 of the second embodiment, the third embodiment and the fifth embodiment with the upper casing 112.

Figure 25:
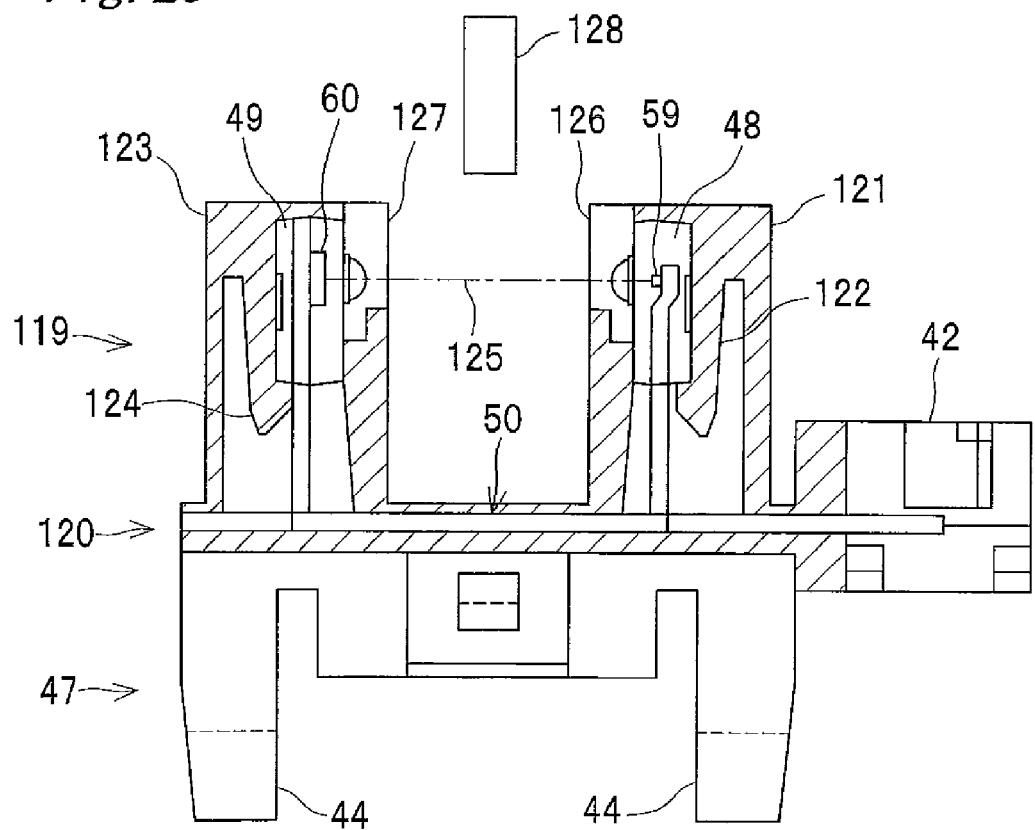
FIG. 25 is a view showing an optical path in a case where the upper casing of the optical coupler shown in FIG. 23 is replaced by an upper casing different from that of FIG. 24, and the device unit is replaced by another device unit.
Figure 27:
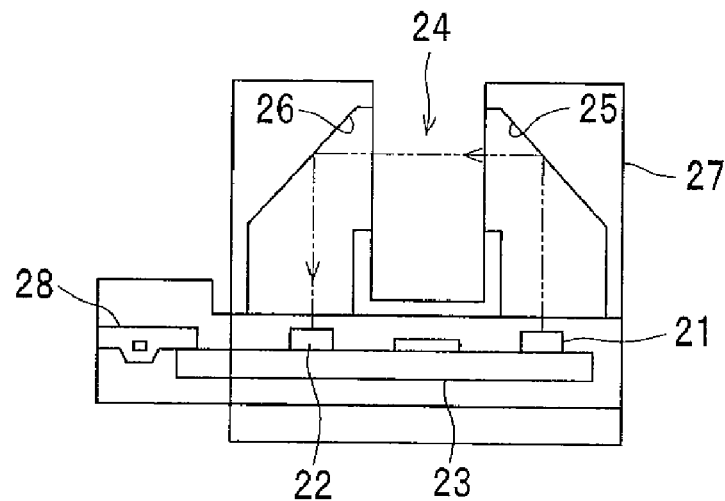
FIG. 27 is a view showing a cross section of a conventional optical coupler different from that of FIGS. 26A through 26C.
Figure 28:
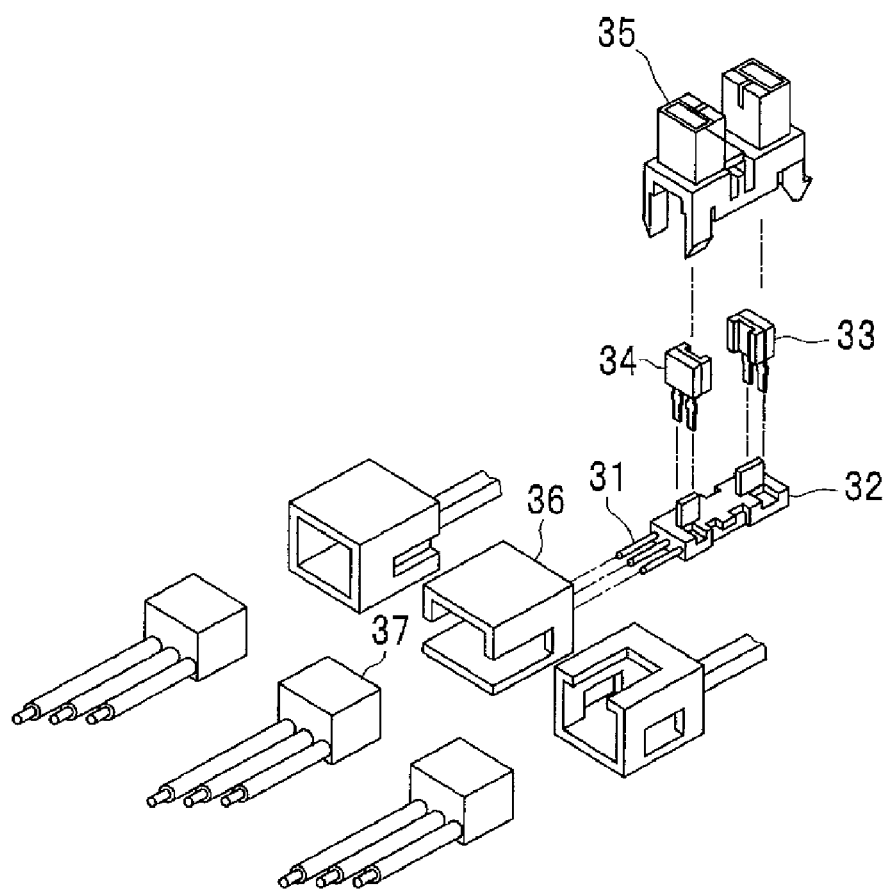
FIG. 28 is a view showing a structure of a conventional optical coupler different from those of FIGS. 26A through 26C and FIG. 27.

FIG. 25 shows an optical path when the upper casing 45 of the first embodiment is replaced by the upper casing 119, and the device unit 46 is replaced by the device unit 120. It is noted that the members other than the upper casing 119 and the device unit 120 are denoted by the same reference numerals as in the case of the optical coupler of the first embodiment shown in FIGS. 1A through 1C and FIGS. 2A and 2B, and no detailed description is provided therefor.

Referring to FIG. 25, in the device unit 120, the portion where the light-emitting mold portion 48 is formed and the portion where the light-receiving mold portion 49 is formed at the lead frame 50 are bent on the same side generally perpendicularly to the main body of the lead frame 50, so that the light-emitting chip 59 of the light-emitting mold portion 48 and the light-receiving chip 60 of the light-receiving mold portion 49 face each other.

Moreover, the upper casing 119 is composed so that a light-emitting device housing chamber 121 houses an upright light-emitting mold portion 48, and the light-emitting mold portion 48 is fixed by a light-emitting portion fixing claw 122. Likewise, a light-receiving device housing chamber 123 houses an upright light-receiving mold portion 49, and the light-receiving mold portion 49 is fixed by a light-receiving portion fixing claw 124.

Light emitted from the light-emitting chip 59 in the light-emitting mold portion 48 of the device unit 120 travels along an optical path 125 toward a window 126 in the light-emitting device housing chamber 121 and once radiated to the outside from the window 126. Then, the light radiated from the window 126 enters the light-receiving device housing chamber 123 through a window 127 provided at the light-receiving device housing chamber 123, travels toward the light-receiving mold portion 49 in the light-receiving device housing chamber 123 and is made incident on the light-receiving chip 60 in the light-receiving mold portion 49.

In the above case, the presence or absence and the passing of a subject (object) 128 to be detected are detected from a change in the quantity of light or the like as a consequence of the interruption of the optical path 125 by the subject (object) 128 to be detected. In the case of the optical coupler having the structure described above, the optical path length can be made shorter than in the optical coupler shown in FIGS. 23 and 24. Therefore, a signal-to-noise ratio can be improved by virtue of the optical path length allowed to be short.

Although the upper casing 45 of the first embodiment is replaced by the upper casing 119, and the device unit 46 is replaced by the device unit 120 in the example described above, it is also possible to replace the upper casings 45, 76, 96 of the second embodiment, the third embodiment and the fifth embodiment with the upper casing 119 and to replace the device units 71, 77, 97 with the device unit 120.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An optical coupler, comprising:
   a lead frame on which a light-emitting device and a light-receiving device molded with a translucent resin are mounted and which has a first external connection terminal for external connection at one end; and
   an exterior casing formed of a light-shielding resin and having a first connector portion that accommodates the first external connection terminal therein, the exterior casing having a first division casing and a second division casing, provided separately from the first division casing, and the exterior casing housing the lead frame therein by holding the lead frame between the first division casing and the second division casing, wherein
   the first division casing has a first division connector portion including a first division connector housing, and the second division casing has a second division connector portion including a second division connector housing, such that the first division connector portion and the second division connector portion form the first connector portion when the first division casing and the second division casing are attached together.

2. The optical coupler as claimed in claim 1, wherein
   a groove is formed at a joining surface of the first division connector housing to the second division connector housing and a joining surface of the second division connector housing to the first division connector housing so as to form a through hole when the first division connector portion and the second division connector portion are integrally joined together and in the through hole the external connection terminal is to be inserted, and
   assuming that an outside diameter of the external connection terminal is L1 and a width of the groove is C1, then a relation: $C1 \geqq L1$ holds.

3. The optical coupler as claimed in claim 1, wherein
   a through hole in which the external connection terminal is inserted is formed at either one of the first division connector housing and the second division connector housing, and,
   assuming that an outside diameter of the external connection terminal is L1 and an inner diameter of the through hole is C1 then a relation: $C1 \geqq L1$ holds.

4. The optical coupler as claimed in claim 1, wherein
   a groove is formed at a joining surface of the first division connector housing to the second division connector housing and a joining surface of the second division connector housing to the first division connector housing so as to form a through hole when the first division connector portion and the second division connector portion are integrally joined together and in the through hole the external connection terminal is to be inserted,
   a plurality of projections are provided on an inner surface of the groove annularly arranged in a plane perpendicular to a central axis of the groove,
   the projections are provided so as not to be positioned at outer end surfaces of the first division connector housing and the second division connector housing, and,
   assuming that an outside diameter of the external connection terminal is L1, and an interval between the projections measured in a widthwise direction of the groove is C1, then a relation: $C1 < L1$ holds.

5. The optical coupler as claimed in claim 1, wherein
   the lead frame further includes a second external connection terminal formed at an other end for another external connection, and
   the exterior casing further includes a second connector portion that accommodates the second external connection terminal therein,
   wherein the first division casing further includes a third division connector portion including a third division connector housing, and the second division casing further includes a fourth division connector portion including a fourth division connector housing, such that the third division connector portion and the fourth division connector portion form the second connector portion when the first division casing and the second division casing are attached together.

6. Electronic equipment employing the optical coupler claimed in claim 1.

7. The optical coupler as claimed in claim 1, wherein the first division connector portion is provided integrally with the first division casing and the second division connector portion is provided integrally with the second division casing.

8. The optical coupler as claimed in claim 5, wherein
   a plurality of pads connected to pins that have an identical function in the first connector portion and the second connector portion are provided for either one of a light-emitting mold portion where the light-emitting device is molded with a translucent resin and a light-receiving mold portion where the light-receiving device is molded with a translucent resin at the lead frame, and
   the plurality of pads connected to the pins that have the identical function are mutually electrically connected in the light-emitting mold portion or the light-receiving mold portion.

* * * * *